(12) United States Patent
Juso et al.

(10) Patent No.: US 6,731,013 B2
(45) Date of Patent: May 4, 2004

(54) WIRING SUBSTRATE, SEMICONDUCTOR DEVICE AND PACKAGE STACK SEMICONDUCTOR DEVICE

(75) Inventors: Hiroyuki Juso, Gose (JP); Yasuki Fukui, Sakai (JP); Yuji Yano, Tenri (JP); Seiji Ishihara, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 30 days.

(21) Appl. No.: 09/873,338

(22) Filed: Jun. 5, 2001

(65) Prior Publication Data

US 2002/0000327 A1 Jan. 3, 2002

(30) Foreign Application Priority Data

Jun. 28, 2000 (JP) ........................................ 2000-194732

(51) Int. Cl.[7] .............................................. H01L 23/48
(52) U.S. Cl. ....................... 257/779; 257/780; 257/783; 257/784; 257/786; 257/787; 174/52.2; 174/52.4; 361/772; 361/777; 361/808
(58) Field of Search ................................. 257/780, 782, 257/783, 784, 786, 700, 701, 737, 738, 787, 778, 779; 174/52.2, 52.3, 52.4; 361/767, 807, 808, 809, 810, 772, 777

(56) References Cited

U.S. PATENT DOCUMENTS

| | | | | |
|---|---|---|---|---|
| 5,581,122 A | * | 12/1996 | Chao et al. ................. | 257/691 |
| 5,677,575 A | * | 10/1997 | Maeta et al. ................ | 257/778 |
| RE36,773 E | * | 7/2000 | Nomi et al. ................ | 361/760 |
| 6,107,679 A | * | 8/2000 | Noguchi ..................... | 257/678 |
| 6,127,724 A | * | 10/2000 | DiStefano .................. | 257/675 |
| 6,291,895 B1 | * | 9/2001 | Taniguchi et al. .......... | 257/782 |

FOREIGN PATENT DOCUMENTS

| | | | | |
|---|---|---|---|---|
| JP | 07273243 A | * | 10/1995 | ........... H01L/23/12 |
| JP | 8-288316 | * | 11/1996 | |
| JP | 9-121002 | | 5/1997 | |
| JP | 1999-39245 | | 6/1999 | |
| JP | 11-204720 | | 7/1999 | |
| JP | 2002319648 A | * | 10/2002 | ........... H01L/23/12 |

OTHER PUBLICATIONS

Korean Notice of Rejection mailed Jun. 30, 2003 and translation thereof in corresponding Korean Application No. 10–2001–33941.

* cited by examiner

Primary Examiner—Alonzo Chambliss
(74) Attorney, Agent, or Firm—Nixon & Vanderhye

(57) ABSTRACT

A wiring substrate of the present invention includes a terminal section, provided on a first surface of an insulating substrate, for wire or flip-chip bondings; a land section, provided on the insulating substrate, for an external connection terminal; wiring patterns, respectively provided on the first surface and a second surface on the other side of the first surface, for making electrical connection between the terminal section and the land section; and a support pattern, provided on the second surface corresponding in position to the terminal section, for improving bondings. The wiring substrate can relieve connection failure in bondings.

25 Claims, 23 Drawing Sheets

WIRING SUBSTRATE, SEMICONDUCTOR DEVICE AND PACKAGE STACK SEMICONDUCTOR DEVICE

FIELD OF THE INVENTION

This invention relates to a semiconductor device which is miniaturized to almost chip size to be suitable particularly for density packaging, and relates to a wiring substrate (printed circuit board) therefor, and to a package stack semiconductor device having a plurality of such a semiconductor device.

BACKGROUND OF THE INVENTION

Recently QFP (Quad Flat Package) type, BGA (Ball Grid Array) type, and CSP (Chip Size package) type semiconductor devices have been widely used as what meets the needs of miniaturizing electronic equipment.

These semiconductor devices need more and more external connection terminals since signal processing of a semiconductor chip (semiconductor-element) mounted therein has been highly speeded and highly facilitated. In such case, the BGA type whose external connection terminals are provided on a bottom face of a semiconductor device in a two-dimensional manner is widely adopted.

Of these BGA type semiconductor devices, conventionally known is a semiconductor device whose semiconductor chip and wiring substrate are connected to each other by wire bonding with a circuit forming surface of the semiconductor chip facing upward, wherein the semiconductor chip is conducted to external connection terminals through the wiring pattern of the wiring substrate. "Upward" means that the circuit forming surface is on the other side of the surface of semiconductor chip facing the wiring substrate.

Such a conventional resin-sealed semiconductor device is disclosed in Japanese Unexamined Patent Publication No. 121002/1997 (Tokukaihei 9-121002) (published date: May 6, 1997).

A semiconductor device which has a structure like this, as shown in FIG. 20, has a wiring substrate 67, a semiconductor chip 52 which is mounted on the wiring substrate 67, an Au wire 53 which connects the semiconductor chip 52 to a terminal section 55 of the wiring substrate 67, a resin sealing section 61 which seals the semiconductor chip 52 and the Au wire 53 with resin by transfer molding.

The wiring substrate 67 has an insulating substrate 63, an insulating material 62 as an insulating layer on the chip side, and a wiring pattern provided between the insulating substrate 63 and the insulating material 62. That is, the wiring substrate 67 has a metallic wiring pattern which is formed on the insulating substrate 63 provided with a through hole 58, and the insulating material 62 is bonded with the metallic wiring pattern thereon.

Further, the wiring substrate 67 is provided with the through hole 58 through the insulating substrate 63 in a direction of thickness according to the wiring pattern. Thus, the wiring pattern is partially exposed on the through hole 58, and the exposed portion of the wiring pattern makes up a land section 56 in FIG. 20.

In addition, the wiring substrate 67 includes an external connection terminal 60 which is formed as a solder ball by reflow soldering. Thus, through the through hole 58, the external connection terminal 60 is connected to the land section 56 provided on the upper side of the through hole 58, and hangs down like a ball from the lower side of the through hole 58.

Among such semiconductor devices, there has been known a semiconductor device having a plurality of semiconductor chips mounted therein in order to increase added values and capacity of a memory and the like in portable devices. For example, a multi-chip module which is provided with a plurality of board-shaped semiconductor chips side by side (in a direction of surface) is known.

However, since semiconductor chips are provided side by side, it is impossible to make a semiconductor device whose area (the area of bottom surface) is smaller than the total area of these semiconductor chips.

In view of this drawback, there has been proposed a semiconductor device (hereinbelow, referred to as stacked package) which improves packaging density by stacking a plurality of semiconductor chips in a direction of thickness and putting these chips in a semiconductor device.

An example of such a stacked package is disclosed in Japanese Unexamined Patent Publication No. 204720/1999 (Tokukaihei 11-204720) (published date: Jul. 30, 1999). The stacked package mentioned above, as shown in FIG. 21, has semiconductor chips 52a and 52b which are stacked together to be mounted on the wiring substrate 67 which insulates electricity. Further, an external connection terminal 60 is provided in a matrix pattern on a land section 56 in the stacked package so that the external connection terminal 60 hangs down from the lower surface of the wiring substrate 67. Thus, the stacked package has the CSP structure which has almost the same size as the semiconductor chip 52a and 52b.

The method of fabricating the stacked package like this is as follows. In the first place, the first semiconductor chip 52b is die-bonded on the wiring substrate 67 with its circuit forming surface facing upward, and then the second semiconductor chip 52a is die-bonded thereon.

Thereafter, each semiconductor chip 52a, 52b is connected to the terminal section 55 of the wiring substrate 67 with an Au wire 53 by wire bonding. In addition, each semiconductor chip 52a, 52b, and the Au wire 53 are sealed with a resin sealing section 61 by transfer molding. Then, a solder ball is provided as the external connection terminal 60 on the land 56 by reflow soldering. The ball is used as the external connection terminal 60. The stacked package mentioned above is produced this way.

Depending on the type of the semiconductor chips 52a and 52b and the position where the external connection terminals 60 are drawn, it is sometimes impossible to form wiring patterns freely on the wiring substrate 67 which has a single layer wiring pattern like the semiconductor device mentioned above. Thus, as shown in FIG. 22, a multi-layer wiring substrate 68 whose wiring pattern, made of Cu, is provided on its both surfaces is sometimes used.

The wiring pattern of the multi-layer wiring substrate is provided not only on the surface of the insulating substrate 63, which is a base material, where the semiconductor chip is mounted (hereinbelow referred to as side A), but also on the surface where the external connection terminal 60 is formed (hereinbelow referred to as side B). The wiring pattern of side B is usually protected with a solder resist 57.

Further, conduction is ensured between the land section 56 of the wiring pattern on side A and the land section 56 of the wiring pattern on side B which faces side A through the through hole 58, by filling the through hole 58 with a conductor 59 such as a conductive paste.

However, there is a problem. As shown in FIG. 23, in the foregoing conventional wiring substrate 68 which is provided with the wiring patterns on side A and side B, inadequate wire bonding is incurred between the semiconductor chip 52 and the terminal section 55.

That is, when the semiconductor chip 52 and the terminal section 55 are connected by wire bonding, the load applied on the terminal section 55 in a direction of thickness of the insulating substrate 63 to make connection causes deformation of the insulating substrate 63. As a result, a load cannot be applied sufficiently on the terminal section 55, and consequently, inadequate wire bonding tends to occur, which, in turn, may cause electrical connection failure between the semiconductor chip 52 and the terminal section 55.

Meanwhile, as shown in FIG. 20, the wiring substrate 67 which is provided with a wiring pattern only on one surface can avoid wire bonding problem mentioned above. That is, side B of the wiring substrate 67 does not have any wiring pattern, or any solder resist to protect wiring patterns, and thus the surface of side B is flat.

Therefore, since the wiring substrate 67 provided with the wiring pattern only on one surface has side B which is flat, the load applied on the terminal section 55 for wire bonding, while side B of the wiring substrate 67 placed on a stage of wire-bonder facing downward, does not cause deformation of the wiring substrate 67 since the load applied to the terminal section 55 can be held by sufficiently the stage.

However, in the case of the multi-layer wiring substrate 68 used in a semiconductor device shown in FIG. 22, side B of the wiring substrate 68 also has the wiring pattern and the solder resist 57 thereon. In such case, side B comes to have protrudent parts depending on areas having or not having the wiring pattern or the solder resist 57 are formed or not formed.

When the insulating substrate 63 of the wiring substrate 68 is comparatively thick, or not less than 0.2 mm thick, the protrudent parts do not pose any problem. But when the substrate is less than 0.2 mm thick, particularly not more than 0.1 mm thick, stiffness of the insulating substrate 63 can becomes weak. It brings about the following problems in assembling the semiconductor device.

Specifically, after providing the semiconductor chip 52 on the insulating substrate 63 by die bonding, the semiconductor chip 52 and the terminal section 55 on the wiring substrate 68 are connected electrically by wire bonding.

Here, if the protrudent part is formed on side B, which is on the other side of the semiconductor chip 52 disposed on side A of the insulating substrate 63, as shown in FIG. 23, the insulating substrate 63 deforms in a direction of thickness when a load is applied on the terminal section 55 for wire bonding in an arrowhead direction (in a direction of thickness of the insulating substrate 63) in wire bonding. Because of this, it was impossible conventionally to apply enough load in wire bonding, posing the problem of inadequate wire bonding which may cause electrical connection failure between the semiconductor chip 52 and the wiring substrate 68.

SUMMARY OF THE INVENTION

The object of the present invention is to provide a wiring substrate, a semiconductor device, and a package stack semiconductor device, all with improved reliability of connection by suppressing occurrence of inadequate electrical connection.

A wiring substrate of the present invention, in order to achieve the foregoing object, includes an insulating substrate, a terminal section for wire bonding or flip-chip connection and a support pattern, provided on a surface of the other side of the surface where the terminal section is provided, and on a position corresponding to the terminal section, for improving reliability of connection of wire bonding.

Therefore, this structure can suppress deformation of the insulating substrate by the support pattern, even when the terminal section is pressed in wire bonding or other connection methods. As a result, reliability of connection in wire bonding or other connection methods, can be improved than conventionally.

A semiconductor device of the present invention, in order to achieve the foregoing object, includes the wiring substrate. Therefore, this structure can provide a thinner semiconductor device with improved reliability of connection in wire bonding or flip-chip connection than conventionally.

A package stack semiconductor device of the present invention, in order to achieve the object mentioned above, comprises the foregoing semiconductor devices which are stacked to each other. Therefore, this structure ensures electrical connection between the semiconductor devices, even when they are stacked using external terminal connections which are provided on land sections which are exposed.

Other objects, characteristics and advantages of the present invention will become apparent from the detailed description taken in conjunction with the accompanying drawings.

BRIEF DESCRIPTION OF THE DRAWINGS

FIG. 4(*a*) is a cross sectional view, and FIG. 4(*b*) is a top view, and FIG. 4(*c*) is a bottom view.

FIG. 11(a) and FIG. 11(b) are explanatory drawings showing layouts of chip selectors in each semiconductor device of the package stack semiconductor device, in which FIG. 11(a) is a plan view of a main portion of the semiconductor device which shows wiring for selection in the semiconductor device, and FIG. 11(b) is a plan view of a main portion of the semiconductor device which shows an example where terminal section has the chip selector function in the semiconductor device.

FIG. 14(a) to FIG. 14(C) are explanatory drawings showing another modified example of the package stack semiconductor device, in which FIG. 14(a) is a front view, and FIG. 14(b) is a side view, and FIG. 14(c) is a plan view.

FIG. 16(a) and FIG. 16(b) are explanatory drawings showing yet another modified example of the wiring substrate, in which FIG. 16(a) is a front view, and FIG. 16(b) is a cross sectional view taken along both dotted lines and arrows of the FIG. 16(a).

DESCRIPTION OF THE EMBODIMENTS

The following describes embodiments of the present invention with reference to FIG. 1 through FIG. 19.

The First Embodiment

Figure 1:
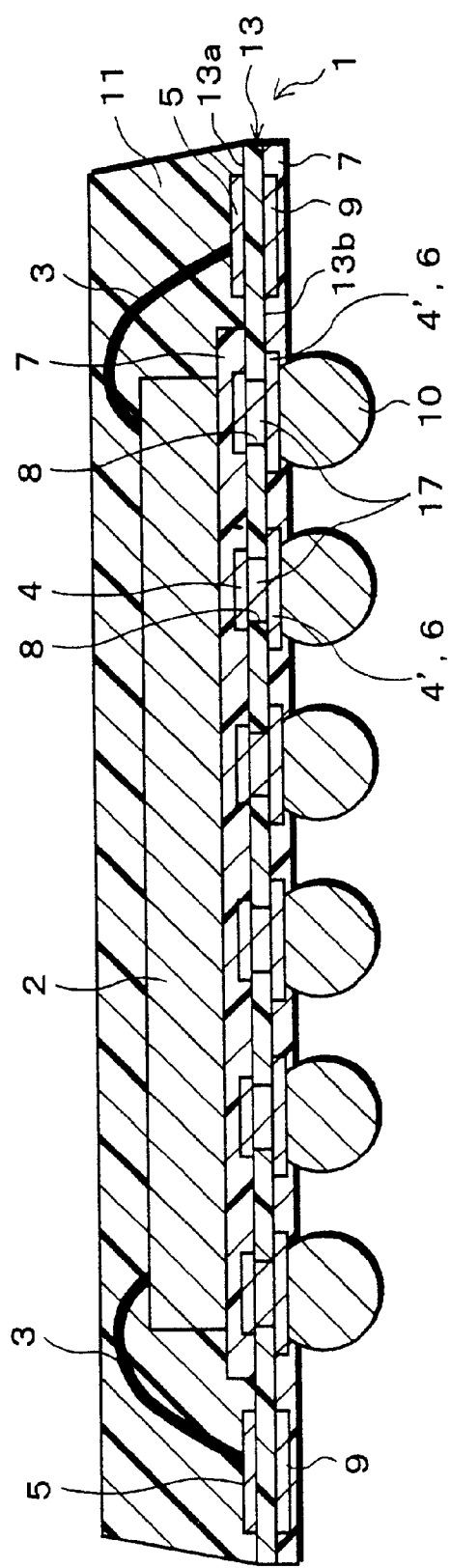
FIG. 1 is a cross sectional view showing a wiring substrate and a semiconductor device using it in the first embodiment according to the present invention.
Figure 2:
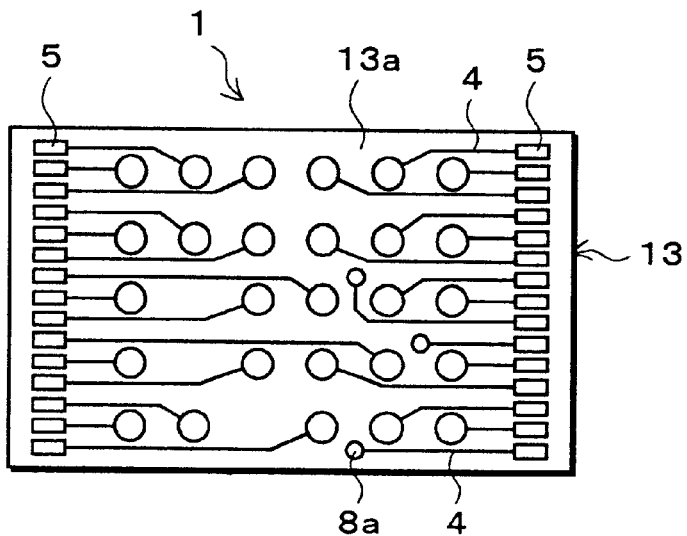
FIG. 2(*a*) to FIG. 2(*c*) are explanatory drawings concerning surfaces on the both sides of the wiring substrate, in which FIG. 2(*a*) shows a layout on side A, and FIG. 2(*b*) shows a layout on side B, and FIG. 2(*c*) shows a modified example of the layout on side B.
Figure 2:
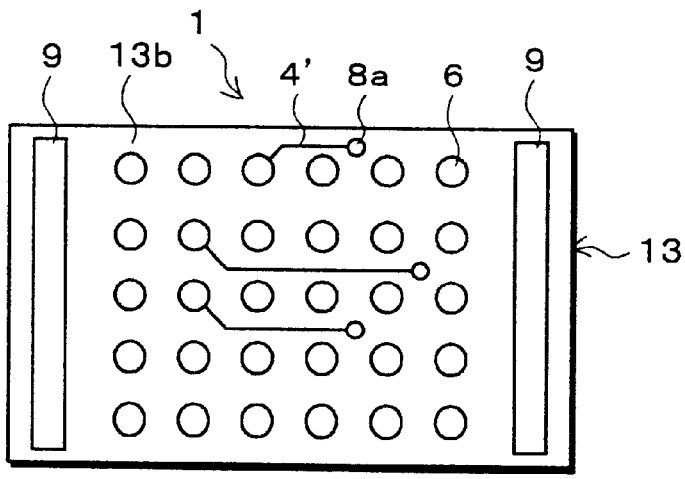
Figure 2:
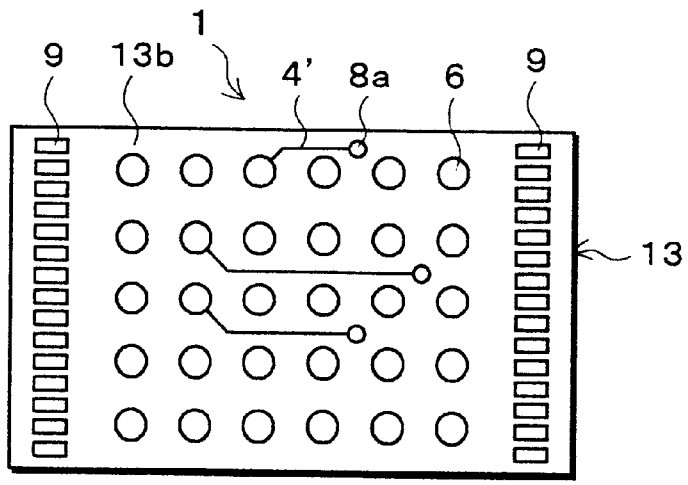
Figure 3:
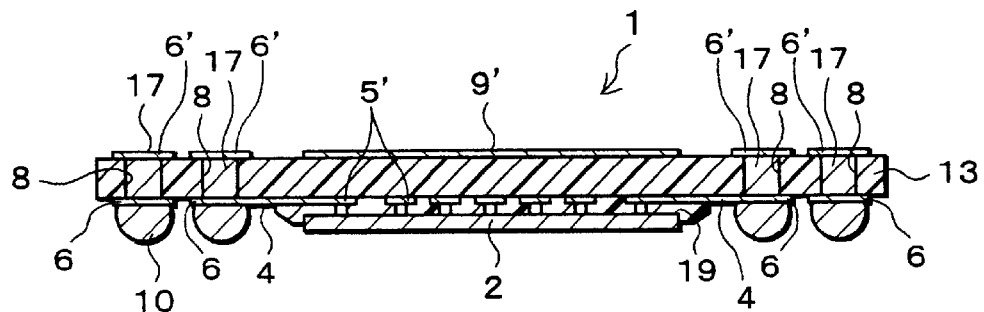
FIG. 3(*a*) to FIG. 3(*c*) are explanatory drawings showing a wiring substrate and a semiconductor device using it in the second embodiment according to the present invention, in which FIG. 3(*a*) is a cross sectional view, and FIG. 3(*b*) is a top view, and FIG. 3(*c*) is a bottom view.
Figure 3:
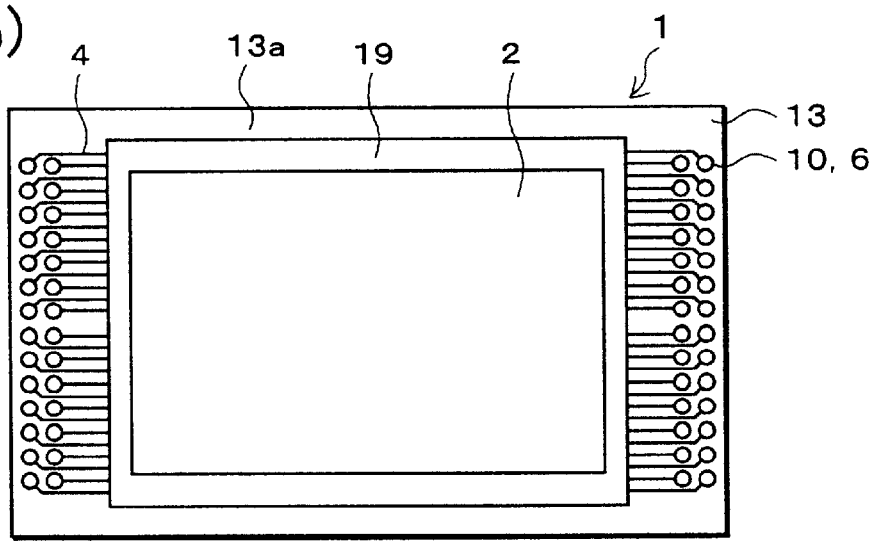
Figure 3:
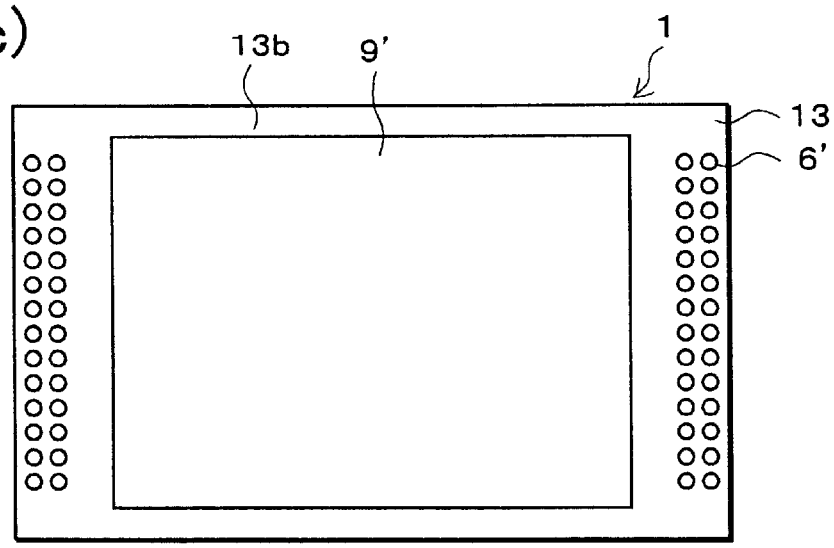
Figure 4:
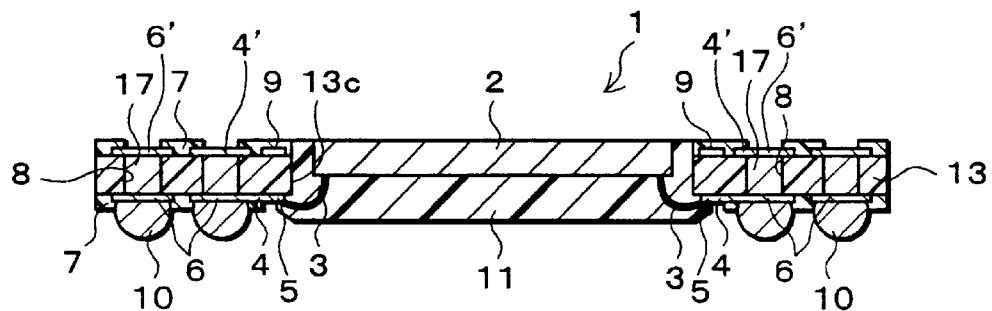
FIG. 4(*a*) to FIG. 4(*c*) are explanatory drawings showing a wiring substrate and a semiconductor device using it in the third embodiment according to the present invention.
Figure 4:
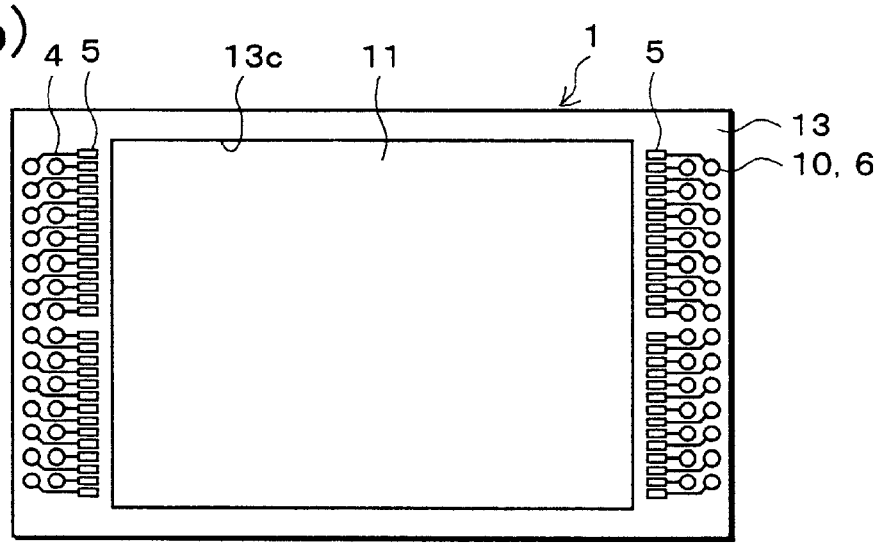
Figure 4:
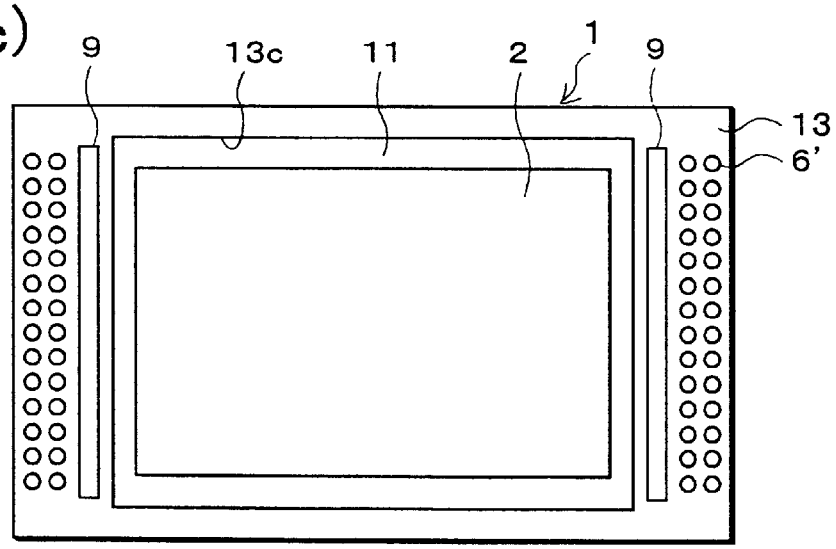
Figure 5:
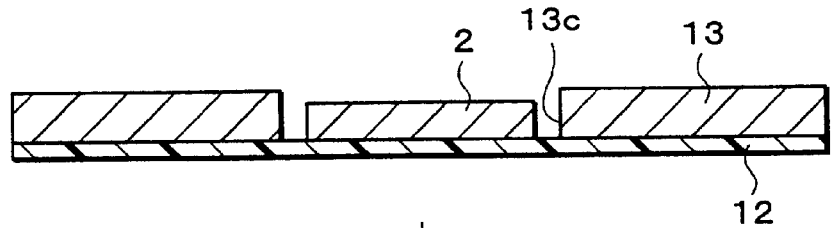
FIG. 5(*a*) to FIG. 5(*e*) are a flow diagram which shows manufacturing steps of the semiconductor device.
Figure 5:
Figure 5:
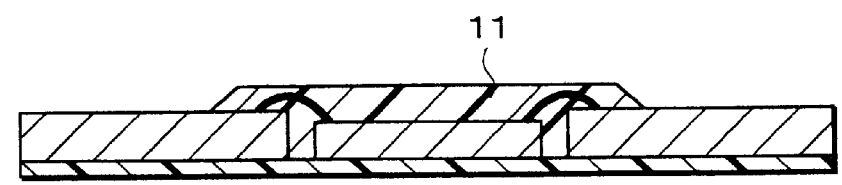
Figure 5:
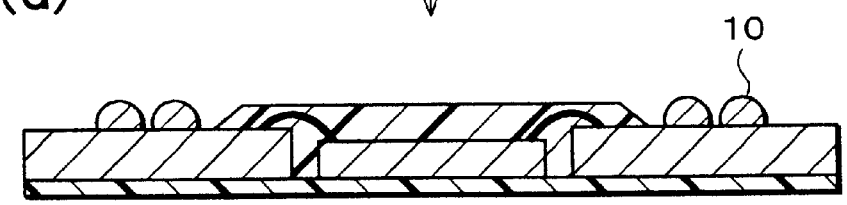
Figure 5:
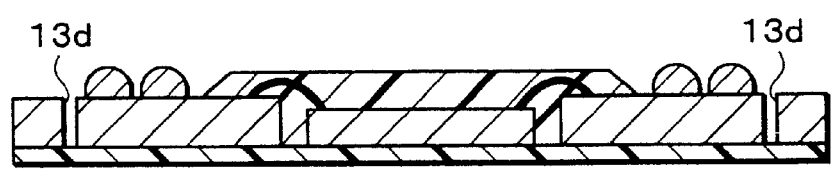

FIG. 1 is a cross sectional view of a semiconductor device in accordance with the first embodiment of the present invention. FIG. 2(a) to FIG. 2(c) are explanatory drawings showing a wiring substrate 1 used in the semiconductor device of the first embodiment in accordance with the present invention, in which FIG. 2(a) shows a wiring pattern 4 of side A 13a of an insulating substrate 13, and FIG. 2(b) shows a wiring pattern 4' of side B 13b of an insulating substrate 13, FIG. 2(c) shows a modification example of the wiring pattern 4'.

The semiconductor device according to the first embodiment, as shown in FIG. 1, has the wiring substrate 1, a semiconductor chip 2, Au wires (bonding wire section) 3, a solder resist 7, an external connection terminal 10, and a resin sealing section 11. Examples of the semiconductor chip 2 include a CPU (Central Processing Unit) and an integrated circuit (L.S.I:Large Scaled Integrated circuit) such as a memory.

The semiconductor chip 2 is mounted on the wiring substrate 1 by die bonding. The Au wires 3 are to electrically connect terminal sections 5 on the wiring substrate 1 to the semiconductor chip 2 by wire bonding. The resin sealing section 11 is to protect the semiconductor chip 2 and the Au wires 3 by covering them with a sealing resin by transfer molding.

The external connection terminal section (conductive member) 10 is provided in the form of solder balls by reflow soldering on land sections 6 (described later), which are formed on a surface (hereinbelow, referred to as side B 13b) on the other side of a surface on which the semiconductor chip 2 is provided (hereinbelow, referred to as side A 13a). The land section 6 is provided on side b 13b.

The wiring substrate 1, as shown in FIG. 1, FIG. 2(a) and FIG. 2(b), has the insulating substrate 13 made of, for example, a 0.06 mm thick glass epoxy material, and the plurality of conductive land sections 6 to connect the semiconductor chip 2 to the external device, are provided, as many as input/output terminals of the semiconductor chip 2, on side B 13b, for example, in a matrix pattern.

Further, the wiring substrate 1 has the plurality of conductive terminal sections 5 made of, for example, Cu foil for wire bonding, which are to be electrically connected to terminals on the upper surface of the semiconductor chip 2 and provided side by side, as many as input/output terminals of the semiconductor chip 2, on the periphery of the side A 13a on which the semiconductor chip 2 is mounted.

Further, on the side A 13a of the wiring substrate 1 is formed the wiring pattern 4, made of conductive metallic foil, for example, such as Cu foil, to electrically connect the land sections 6 to the corresponding terminal sections 5. Thus, in order to connect the ends of the wiring pattern 4 to the land sections 6 electrically, through hole sections 8 are provided through the insulating substrate 13 between the ends of the wiring pattern 4 and the land sections 6, and connection sections 17 which are plated with silver, gold and the like, or are filled with a conductive paste are provided on the through hole section 8.

Further, in the side B 13b, on the other side of the side A 13a of the wiring substrate 1, the wiring pattern 4' is provided to electrically connect the land sections 6, which cannot be connected completely through the wiring pattern 4, to the corresponding terminal sections 5. The wiring pattern 4' is made of conductive metallic foil such as Cu foil.

In order to connect this wiring pattern 4' to the corresponding land sections 6 via the wiring pattern 4 on side A 13a, through hole sections 8a are provided according to the wiring pattern 4'. The through hole sections 8a enable the wiring pattern 4 and the wiring pattern 4' which lead to the through hole sections 8a to be connected electrically in accordance with an electrical conductor (not shown) such as a metal eyelet, for example, made of Cu, the plating mentioned above, or a conductive paste. Thus, the wiring pattern 4 of side A 13a includes a wiring pattern which connects the terminal sections 5 to the corresponding land sections 6 via the through hole sections 8.

Further, on the side B 13b of the wiring substrate 1, a support pattern 9 having almost the same, or preferably the same height as the wiring pattern 4' or land sections 6 is provided on a position corresponding to or facing to the position where the terminal sections 5 are formed. The support pattern 9 is provided on substantially in the form of strips opposing each other on the sides of the side B 13b corresponding to the terminal sections 5. Further, the support pattern 9 may be provided according to, or at the same height as, the height of the highest protrudent part on side B 13b.

The support pattern 9 is preferred to be made of the same material as the land sections 6 or the wiring pattern 4', because this makes it easy to produce them at once, and to match their heights, using the etching pattern for forming the terminal sections 5 on side A 13a when forming the wiring pattern 4' by etching, etc.

In the wiring substrate 1, a semiconductor chip 2 is mounted on side A 13a of the insulating substrate 13, and the input/output terminals (not shown) on the circuit forming surface on the upper surface of the semiconductor chip 2 (the underside of the semiconductor chip 2 is connected to the insulating substrate 13 by die bonding) are respectively connected to the terminal sections 5 electrically via the Au wires 3 by wire bonding.

As a rule, wire bonding employs fixing on a stage of a wire bonder by suction, or fixing by the pressure of a clamper. If the wiring substrate 1 has enough stiffness, deformation of the wiring substrate 1 can be prevented when a load is applied on the wiring substrate 1 in wire bonding to make connection, even when there are irregularities such as the wiring pattern 4' on side B 13b of the wiring substrate 1, and fixing is not enough. This enables the electrical connection by wire bonding to be highly reliable.

On the other hand, as in the wiring substrate 1 mentioned in the first embodiment, when the insulating substrate 13 is as thin as, for example, 0.06 mm and the stiffness is not enough, the terminal sections 5 may be able to be fixed or supported sufficiently. In such a case, the insulating substrate 13 deforms in a direction of thickness when a load is applied on each terminal sections 5 on the insulating substrate 13 in a direction of thickness of the insulating substrate 13 in wire bonding. This brings about inadequate wire-bond connection due to failure in applying a load.

When the wiring pattern 4 is provided on only side A 13a, and when side B 13b is flat, the wiring substrate 1 like this can avoid inadequate wire bonding because it allows the insulating substrate 13 to be sufficiently fixed even when the insulating substrate 13 of the wiring substrate 1 is thin.

However, the wiring substrate 1 of the first embodiment is thin, and the wiring pattern 4' and the like is formed on side B 13b. Thus, there are irregularities in height on side B 13b. Not the whole area of the wiring substrate 1 may be supported and fixed, but at least the side B 13b in position corresponding to the terminal sections 5 to be wire bonded needs to be fixed.

As such is the case, the wiring substrate 1 according to the present invention has the support pattern 9 which is provided on side B 13b corresponding in position to the terminal sections 5, taking into consideration the height of other sections such as the wiring pattern 4' on side B 13b. This allows the load to be supported on the support pattern 9 in wire bonding, thus preventing deformation of the wiring substrate 13 (elastic deformation or plastic deformation) when applying a load.

Therefore, the wiring substrate 1 allows a load to be accurately applied at a pre-set value, thereby ensuring electrical connection between the Au wires 3 and the terminal sections 5.

Note that, in the wiring substrate 1, the support pattern 9 which is formed on the side B 13b corresponding in position to the terminal sections 5 is provided so that the insulating substrate 13 can be supported on a wire bonder stage to prevent deformation of the insulating substrate 13 at the point of applied pressure. Thus, not only the dummy pattern but also the wiring pattern 4' which is connected to the land sections 6 can be used as the support pattern 9. Either as shown in FIG. 2(c), the support pattern 9 may be divided into plural parts, for example, according to the layout of the terminal sections 5.

The Second Embodiment

FIG. 3(a) to FIG. 3(c) are explanatory drawings showing a semiconductor device of the second embodiment in accordance with the present invention, in which FIG. 3(a) is a cross sectional view, FIG. 3(b) is a top view, and FIG. 3(c) is a bottom view. In the semiconductor device of the second embodiment, as shown in FIG. 3(a) to FIG. 3(c), a semiconductor chip 2 and a wiring substrate 1 are connected electrically and fixed by each other, by connecting the semiconductor chip 2 in flip-chip with terminal sections 5', using, for example, an anisotropy conductive film 19.

In this semiconductor device, external connection terminal sections 10 are provided by connecting solder balls by reflow soldering on land sections 6 of external connection terminals of the surface on which the semiconductor chip 2 is mounted, i.e., side A 13a. Thus, a wiring pattern 4 is provided on side A 13a so as to respectively connect the terminal sections 5' to the land sections 6 electrically.

The wiring substrate 1 according to the second embodiment of the present invention has land sections 6' for connecting semiconductor devices. The land sections 6' are provided on side B 13b of an insulating substrate 13 which is made of a material, for example, such as glass epoxy with a thickness of not more than 0.1 mm, on a position facing land sections 6. The land sections 6 and the land sections 6' for connecting semiconductor devices are connected electrically through connection sections 17 of the through hole sections 8. Therefore, the land sections 6' and the land sections 6 facing each other are provided such that they have the same electrical signal.

The wiring substrate 1 a support pattern 9', similar to the support pattern 9 mentioned above, on side B 13b of the insulating substrate 13 on the other side of the area on which the semiconductor chip 2 is mounted in flip-chip, taking into consideration the height of the land sections 6' for connecting semiconductor devices, so that pressure of flip-chip connection can be sufficiently applied to each point of connection between the semiconductor chip 2 and the terminal sections 5' of the wiring substrate 1. This ensures that the surface of the side B 13b is flat in connecting based on flip-chip.

In short, by the provision of the support pattern 9', electrical connection between the semiconductor chip 2 and each terminal section 5' of the wiring substrate 1 is ensured.

The Third Embodiment

FIG. 4(a) to FIG. 4(c) are explanatory drawings showing a semiconductor device according to the third embodiment of the present invention, in which FIG. 4(a) is a cross sectional view, FIG. 4(b) is a top view, and FIG. (c) is a bottom view. The members which have the same functions as those described in the first and second embodiments are given the same reference numerals thereof are omitted as long as they are not needed.

In the semiconductor device of the third embodiment, as shown in FIG. 4(a) to FIG. 4(c), FIG. 6 and FIG. 7(a) to FIG. 7(c), a wiring substrate 1 having an opening section 13c in which a semiconductor chip 2 is mounted is connected to the semiconductor chip 2 via Au wires 3, and the Au wires 3 and a circuit forming surface of the semiconductor chip 2 are sealed with a resin sealing section 11, and external connection terminal sections 10 are mounted on the same surface as the resin-sealed surface.

A method of fabricating the semiconductor device of the third embodiment shown in FIG. 4(a) to FIG. 4(b) is described below, based on FIG. 5(a) to FIG. 5(e).

In the first place, the wiring substrate 1 is prepared by forming the opening section 13c of a substantially rectangular shape in substantially the middle of the insulating substrate 13 where the semiconductor chip 2 is to be mounted. A film 12 which has an adherent is pasted on the adherent to one surface of the wiring substrate 1 which has the opening section 13c.

Next, the semiconductor chip 2 is mounted on the film 12 in the opening section 13c. In mounting the semiconductor chip 2, the surface of the semiconductor chip on the other side of the surface where input/output terminals are formed (hereinbelow referred to as a back surface) is pasted to the film 12 (see FIG. 5(a)).

Thereafter, the semiconductor chip 2 is connected to the terminal sections 5 of the insulating substrate 13 electrically via the Au wires 3 by wire bonding (see FIG. 5(b)), and the resin sealing section 11 is formed to seal over the circuit forming surface of the semiconductor chip 2 and the Au wires 3 (see FIG. 5(c)).

Next, land sections 6 of an external connection terminals are soldered by reflow after printing a soldering paste thereon so as to form the external connection terminal sections 10 (see FIG. 5(d)). Then, the wiring substrate 1 is divided into individual semiconductor devices at cutting grooves 13d using a dicing cutting device (see FIG. 5(e)). Each divided semiconductor device is picked up and put on a tray.

Figure 6:
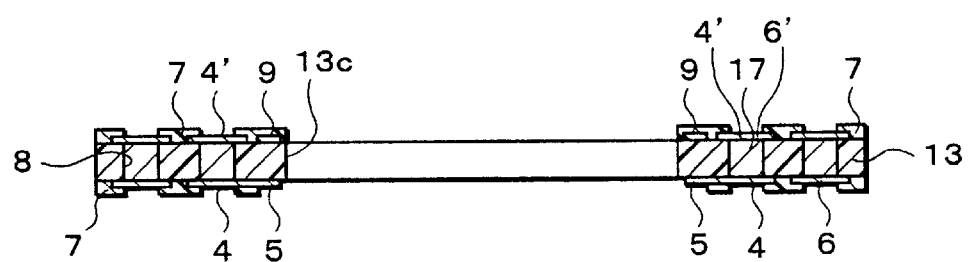
FIG. 6 is a schematic cross sectional view showing a wiring substrate used in the semiconductor device.
Figure 7:
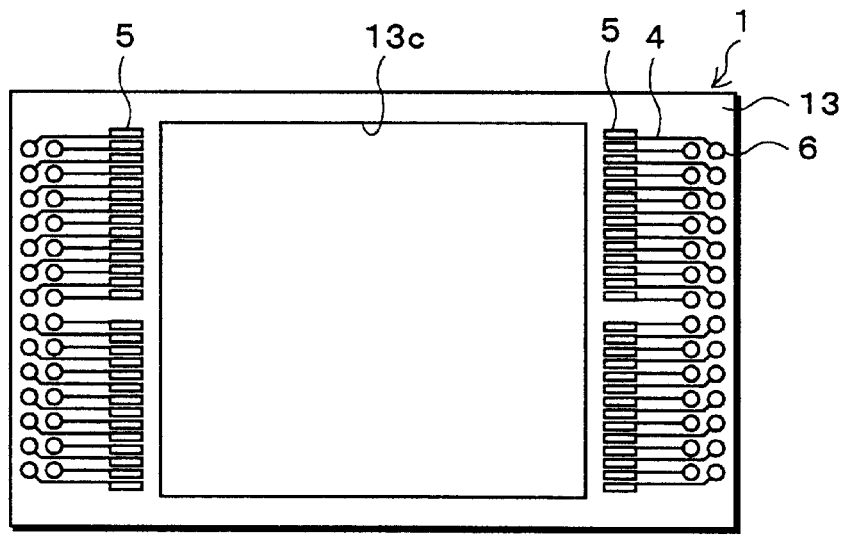
FIG. 7(*a*) and FIG. 7(*b*) are explanatory drawings showing the wiring substrate mentioned above, in which FIG. 7(*a*) is a top view, and FIG. 7(*b*) is a bottom view.
Figure 7:
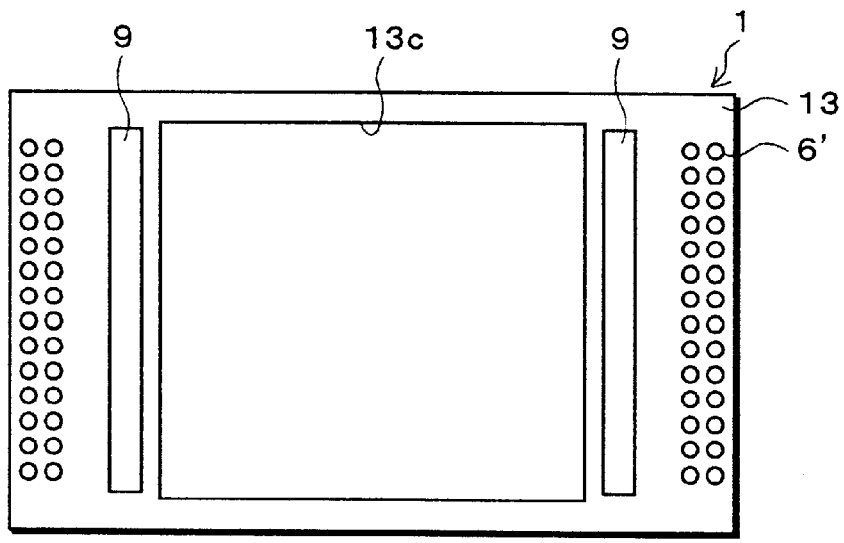

More concrete description of production process is given below. FIG. 5(a) to FIG. 5(e) show manufacturing steps of the semiconductor device according to the third embodiment. FIG. 6 is a cross sectional view of the wiring substrate 1 having wiring on both surfaces, which is used for the foregoing semiconductor device. FIG. 7(a) and FIG. 7(b) show an example of wiring patterns 4 on the both surfaces.

The insulating substrate 13 of the wiring substrate 1 is made of a 0.06 mm to 0.1 mm thick epoxy which contains glass fibre cloth, has the opening section 13c, in which the semiconductor chip is mounted, is provided by boring by means of a rooter or a die.

The wiring substrate 1 is provided with wiring patterns 4 and 4', which are made of Cu, on both sides, and these corresponding wiring patterns 4 and 4' are connected to each other by connection sections 17 of through hole sections 8. Further, land sections 6, which are external connection terminals, are provided on the surface of the insulating substrate 13 where the terminal sections 5 are formed, and land sections 6' for connecting semiconductor devices are provided on the other side of the insulating substrate 13.

Further, a support pattern 9, similar to the foregoing support pattern 9, is provided on the other side of the surface where the terminal sections 5 for wire bonding is formed, so as to improve wire bonding.

For example, the land sections 6 are disposed with 0.5 mm and the diameter of 0.2 mm to 0.3 mm. The through hole sections 8 may be provided just under the land sections 6 in a pad-on manner, or may be provided on a different position from the land sections 6 so as to make connection by the wiring pattern 4. All the wiring except the land sections 6, 6' and terminal sections 5 for the wire bonding is covered with a solder resist 7 for protection. The finished wiring substrate 1 is about 0.1 mm to 0.2 mm thick.

The following describes a manufacturing process of the semiconductor device mentioned above based on FIG. 5(a) to FIG. 5(e). The film 12 to be a mount of the semiconductor chip 2 is pasted on the semiconductor chip mounting opening section 13c of the wiring substrate 1 having the wiring patterns 4 and 4' on the both surfaces of the insulating substrate 13, so that the semiconductor chip 2 is mounted on the film 12 in opening section 13c. Preferably, the film 12 has enough heat resistance with respect to the heat history of each assembling steps of the semiconductor device. Also, the film 12 preferably includes an adhesive component on one of its surfaces so that it can anchor the semiconductor chip 2 and can easily be pasted on the insulating substrate 13 (see FIG. 5(a)).

Then, the wiring substrate 1 and the semiconductor chip 2 are connected by wire bonding, i.e., by the Au wires 3. In order to provide a thin semiconductor device, extremely low loop wire bonding is employed. Wire bonding enables the semiconductor chip 2 and the wiring substrate 1 to be connected flexibly.

Employing other connection method such as flip-chip bonding or single point bonding requires redesigning of the wiring substrate 1 needs according to the type of the semiconductor chip 2. However, with the use of wire bonding, redesigning of the wiring substrate 1 is not needed. Even when pad pitch of the semiconductor chip 2 is changed by chip shrink, or when a semiconductor chip 2 with a standardized terminal sequence of an element such as a memory is used (referred in FIG. 5(b)).

Thereafter, the semiconductor chip 2 and the Au wires 3 are sealed with resin, so as to form the resin sealing section 11. Only the circuit forming surface of the semiconductor chip 2 is sealed by transfer molding. The method of sealing is not just limited to transfer molding, and other methods such as wiring by potting or printing using a screen mask may be employed as well. (see FIG. 5(c)).

The external connection terminal sections 10 are formed in the form of semi-spheres by reflow soldering after printing a solder paste on the land sections 6 which is on the same surface as the mold-sealed surface of the wiring substrate 1. The external connection terminal sections 10 may be made with a solder ball instead of a solder paste by a ball mount method, in the same manner as the usual BGA (see FIG. 5(d)).

After forming the external connection terminal sections 10, a cutting grooves 13d are provided by dicing, so as to divide the semiconductor device into individual pieces (see FIG. 5(e)). The method of dicing the semiconductor device is not just limited to dicing but it may be cut using a looter or a die. Alternatively, if slits are provided between semiconductor devices of the wiring substrate 1 in advance, the device can be effectively cut at the slits.

In the semiconductor device of the third embodiment, by setting the thickness of the external connection terminal sections 10 to about 0.1 mm to 0.15 mm, the semiconductor device can be manufactured with the thickness of about 0.2 mm to 0.3 mm.

The Fourth Embodiment

A stacked semiconductor device (hereinbelow referred to as a package stack semiconductor device) as the fourth embodiment according to the present invention is described below.

The semiconductor devices according to the first to third embodiments include the land sections 6 and the land sections 6' for connecting semiconductor devices, which are provided on the both surfaces of the wiring substrate 1. This allows the semiconductor devices to be connected electrically by stacking them, regardless of the size and the type of the semiconductor chip 2, taking into consideration or, for example, by matching the external sizes of the semiconductor devices and the layout of the external connection terminal sections 10. Two or more semiconductor devices can be used as the one package stack semiconductor device this way.

Figure 8:
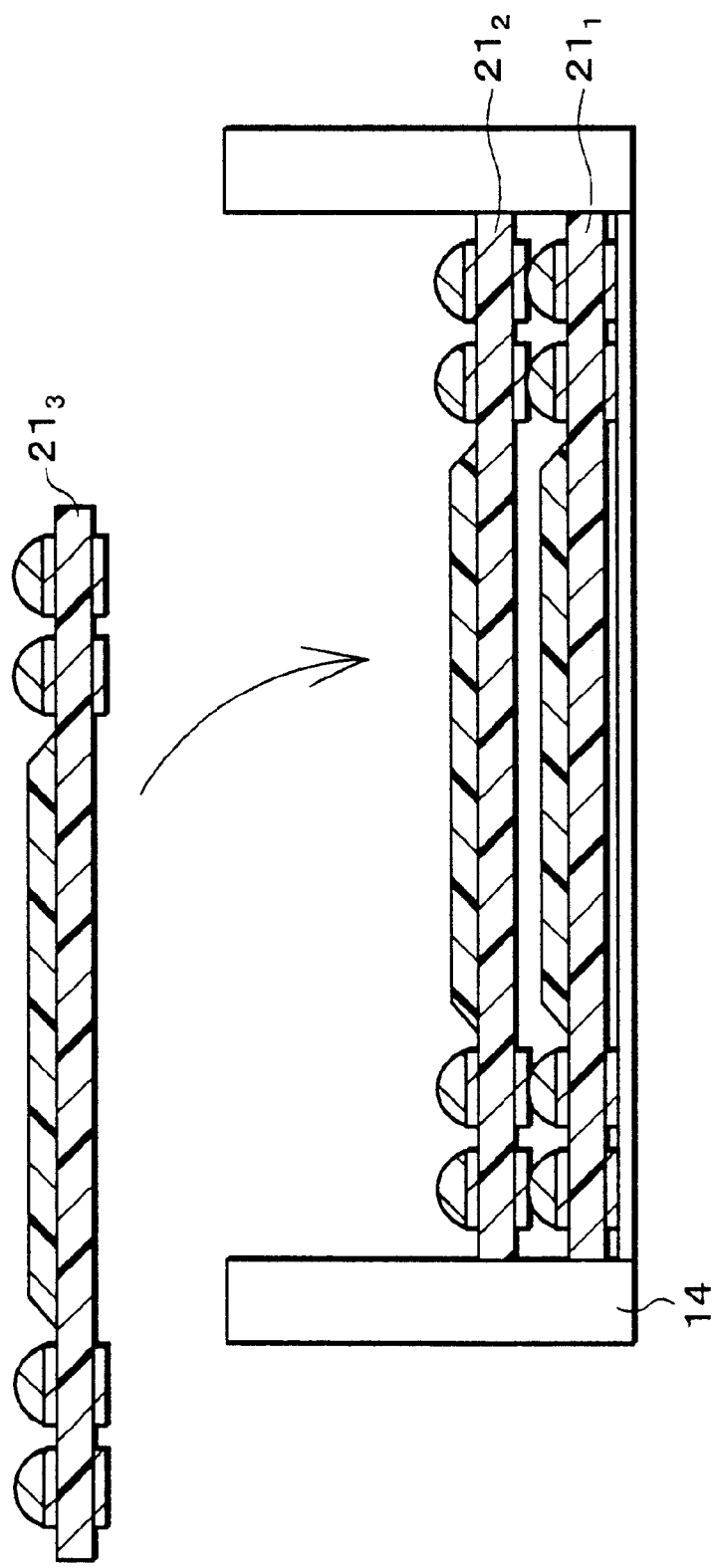
FIG. 8 is an explanatory drawing showing a package stack semiconductor device according to the present invention.

The package stack semiconductor device includes stacked semiconductor devices as shown in FIG. 8. On a semiconductor device $21_1$ placed in the top position, semiconductor device $21_2$ and $21_3$ are stacked in this order, with the external connection terminal sections 10 facing upward (toward an installation opening) in a tray 14. Thereafter, the semiconductor devices $21_1$ to $21_3$ are connected to each other by reflow soldering.

The package stack semiconductor device of this type may be used as a stacked semiconductor device as it is, or, after reflow soldering, fixing resin (mentioned below) may be injected into gaps between each semiconductor device, so as to bring about reliability of the semiconductor device.

If the position of each semiconductor device 21 in the package stack semiconductor device is decided in advance before assemblage, it is preferable that a usually employed Sn—Pb solder is used for the external connection terminal sections 10 of a semiconductor device $21_N$ (N is the number of stacked semiconductor devices) which is placed in the bottom position (i.e., a semiconductor device having the external connection terminal sections 10 which are exposed for extend connection), and a solder having a higher melting point than that of the Sn—Pb solder is used for the semiconductor devices $21_1$ to $21_{N-1}$ above the semiconductor device $21_N$.

In short, the reflow soldering for electrically connecting the stacked semiconductor devices 21 are carried out under temperature conditions according to the solder having a higher melting point, and the reflow soldering of the substrate mounted on the semiconductor device $21_N$ is carried out under normal conditions. As a result, this method of soldering can minimize melting and bleed of solder when connecting the semiconductor device $21_1$ to $21_{N-1}$.

Figure 9:
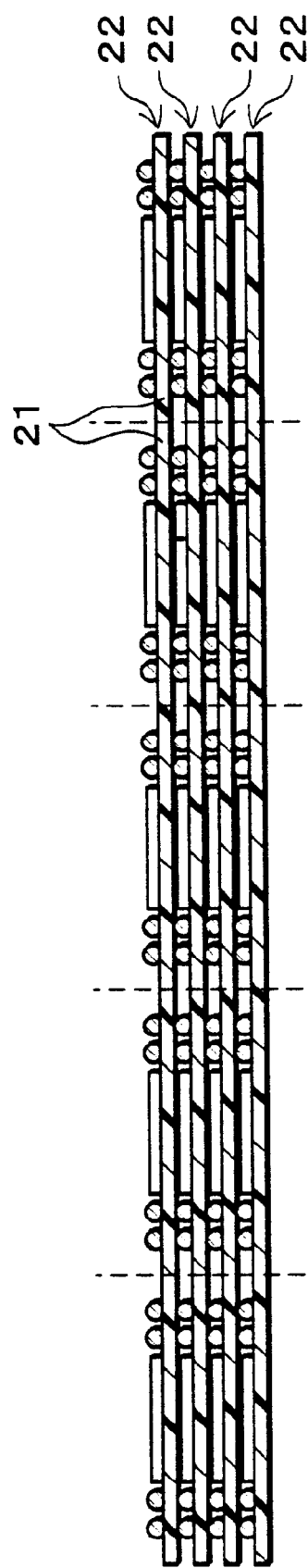
FIG. 9 is an explanatory drawing showing how to manufacture the package stack semiconductor device.
Figure 10:
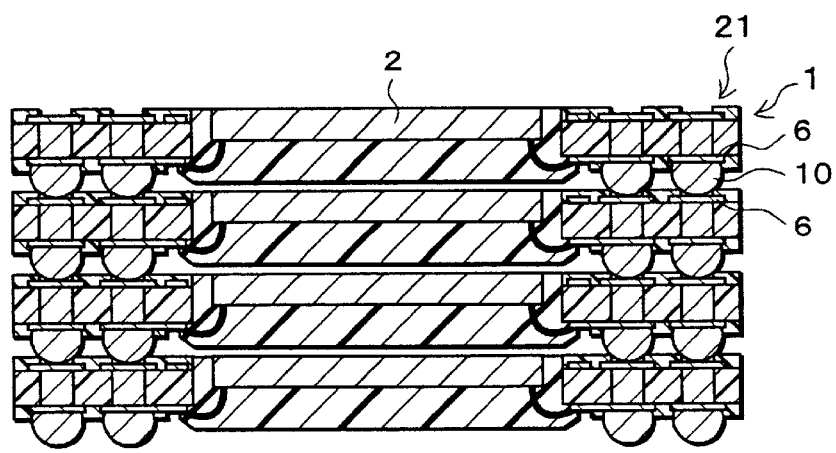
FIG. 10(*a*) and FIG. 10(*b*) are explanatory drawings showing other examples of the package stack semiconductor device, in which FIG. 10(*a*) is a schematic cross sectional view showing four stacked semiconductor devices, and FIG. 10(*b*) is a schematic cross sectional view of the package stack semiconductor device which fixing resin is injected between the semiconductor devices.
Figure 10:
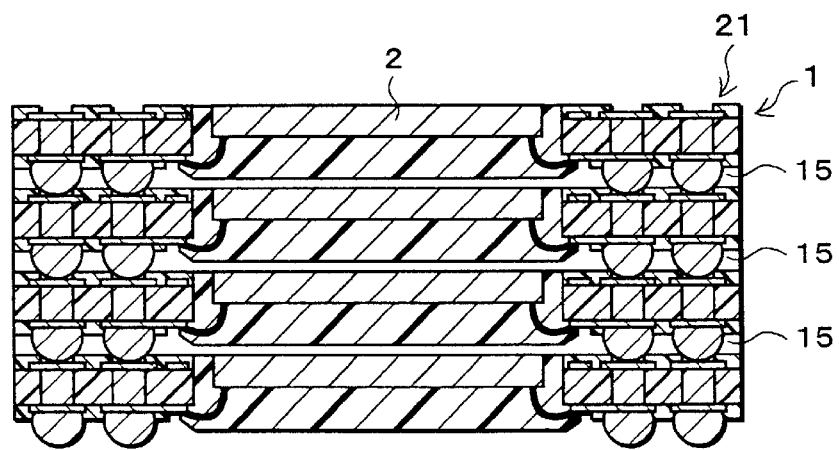
Figure 11:
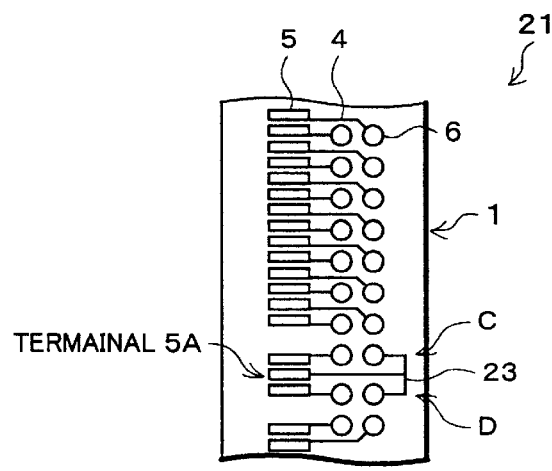
Figure 11:
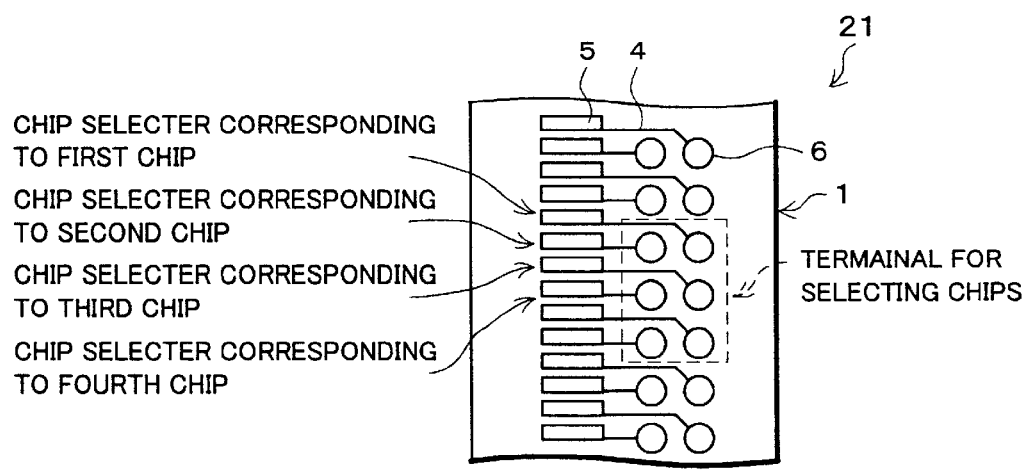

As shown in FIG. 9, the semiconductor device 21 may be stacked in the form of a collection of semiconductor devices 22 in a frame before being divided into individual pieces. These stacked semiconductor devices may be cut according to the sectional lines shown in FIG. 9, or, alternatively, gaps between each semiconductor device may be filled with fixing resin, so as to eliminate gaps between the semiconductor devices 21 where they are cut, thus cutting the semiconductor devices more stably and effectively.

FIG. 10(a) shows a cross sectional view of a package stack semiconductor device which is made up of four of the semiconductor devices 21 mentioned above. FIG. 10(b) is a cross sectional view of a form injected with the fixing resin 15.

In the case where semiconductor devices which have the same type of semiconductor chip 2 are stacked, by setting the external connection terminal sections 10 at the same position between the semiconductor devices 21, except terminals for chip selection. The signals of the semiconductor devices 21 of the upper stages can be conveyed to an external substrate via the land sections 6' of the semiconductor devices 21 of the lower stage.

Preferably, each semiconductor device 21 should be provided with terminals for chip selection in order to be identified when used in a package stack semiconductor device.

If the number of the chip selector terminals in the wiring substrate 1 is the same as or more than the number of stacked semiconductor devices 21, it is possible to stack semiconductor devices 21 manufactured with the same wiring substrate 1 only by changing wire connection. FIG. 11(b) shows an example of four stacked semiconductor devices (for convenience, the lowest semiconductor devices is called "the first" and the second lowest "the second" and the like).

When the semiconductor devices 21 stacked in a package stack have the same type of the semiconductor chip 2, redesigning of the substrate of each semiconductor device will not be required, and the position of stacking can be changed only by changing a wire bonding position.

If the semiconductor chip 2 and the wiring substrate 1 are connected electrically by a method other than wire bonding, such as the flip-chip connection or inner lead bonding, the connection terminals cannot be changed using the same wiring substrate 1 as in wire bonding.

While, as shown in FIG. 11(a), by providing and setting wiring 23 near the terminal sections 5 for connecting the chip selector terminals on the side of the wiring substrate 1, a package stack position can be set by providing a cut-out section or a through hole section in the wiring substrate 1 of each semiconductor device 21 and by disconnecting the wiring 23.

A terminal section 5A in the figure is wire bonded and the wiring 23 at point C is disconnected when the semiconductor device 21 is used as a tip selector A. On the other hand, the terminal section 5A is connected and the wiring is disconnected at point D when the semiconductor device 21 is used as a tip selector B.

So, even when the semiconductor devices 21 which have the same type of semiconductor chip 2 and the wiring substrate 1 are stacked, it is possible to identify each semiconductor device 21 in terms of electricity and appearance. The cut-out section or the through hole section may be provided on the wiring substrate 1 while the wiring substrate 1 is being processed, or while the semiconductor device 21 is being divided, or after the semiconductor device 21 is divided.

Figure 12:
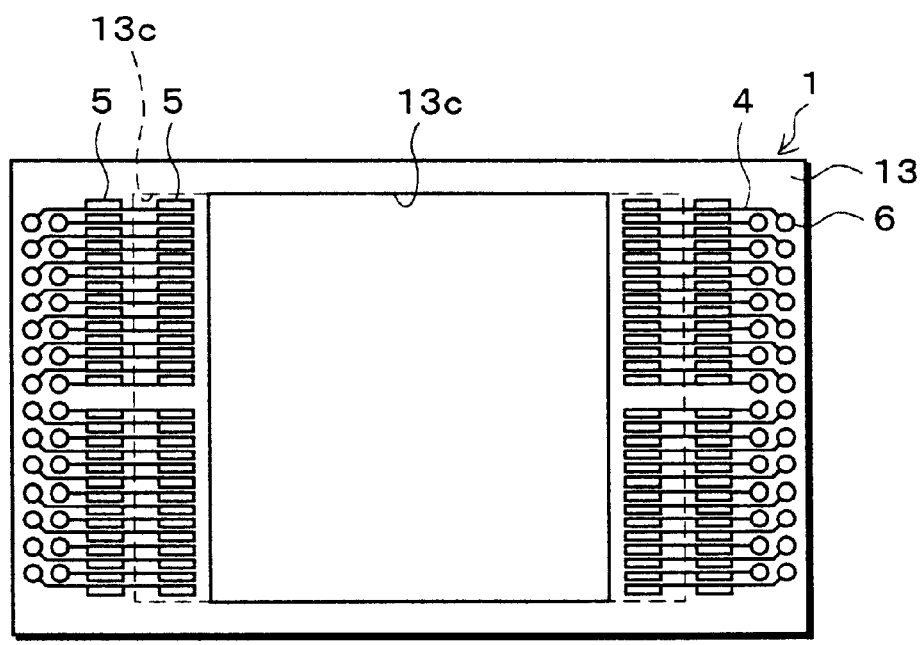
FIG. 12 is a schematic plan view showing another modified example of the wiring substrate.

The wiring substrate 1 like this enables the chips to be identified with fewer terminals than the number of stacked semiconductor devices 21. Thus, the number of the terminal sections 5 for wire bonding can be decreased. Different appearance of the semiconductor devices 21 also makes it easy to identify the chips.

Where there exist chips which are greatly different in size but having a similar terminal layout, the wiring substrate 1 as shown in FIG. 12 is used and the size of the opening section 13c where the chip is mounted is changed. This makes it possible to increase the type of the semiconductor chip 2 which can be adapted to the same wiring substrate 1, without requiring redesigning of the substrate.

When the size of the semiconductor chip 2 is small, a square surrounded by a solid line in the figure is cut out as the opening section 13c and inner terminal sections 5 are used for wire bonding. When the size of the semiconductor chip 2 is large, a square surrounded by a broken line (larger than the square surrounded by solid line) is cut out as the opening section 13c and outer terminal sections 5 are used.

Figure 13:
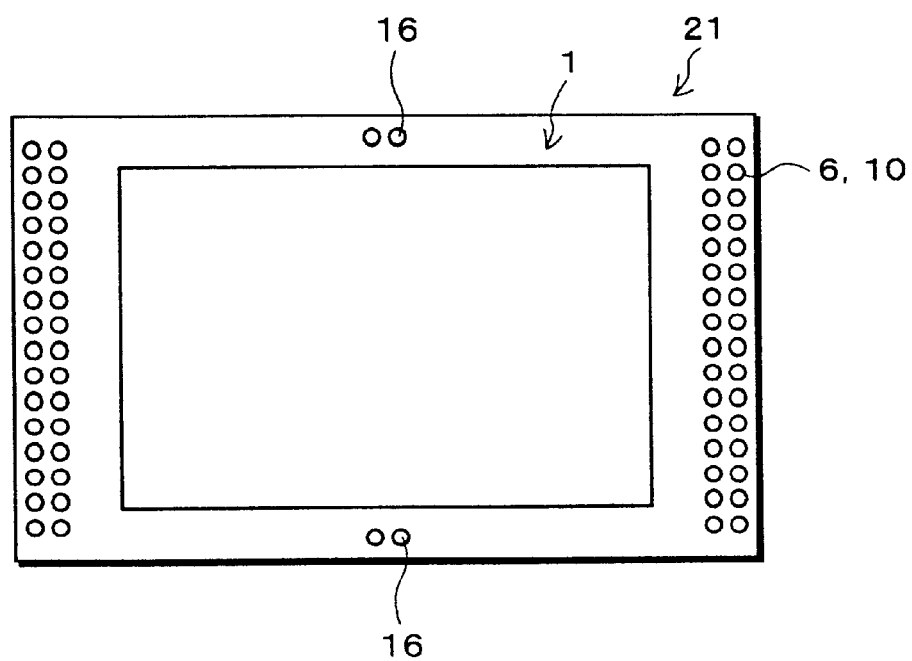
FIG. 13 is a schematic plan view showing yet another modified example of the wiring substrate.
Figure 14:
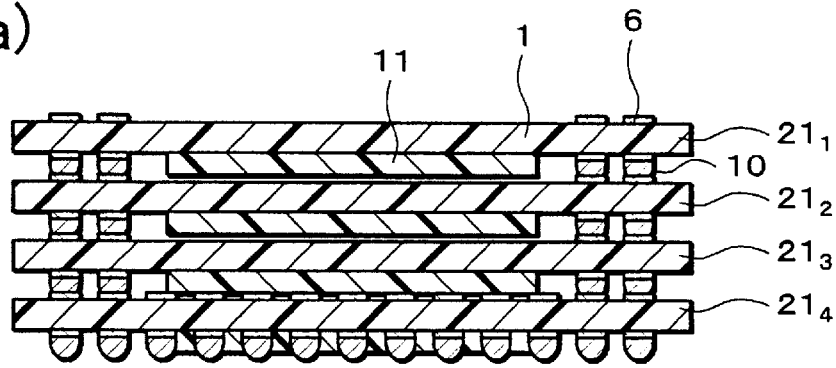
Figure 14:
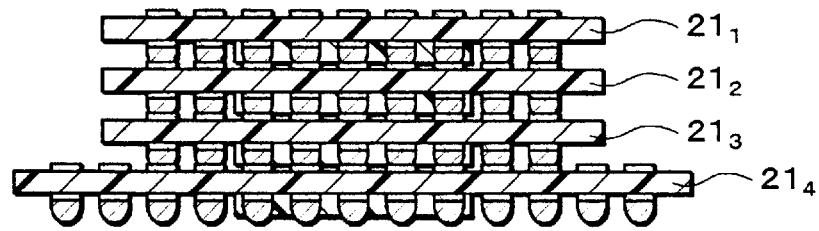
Figure 14:
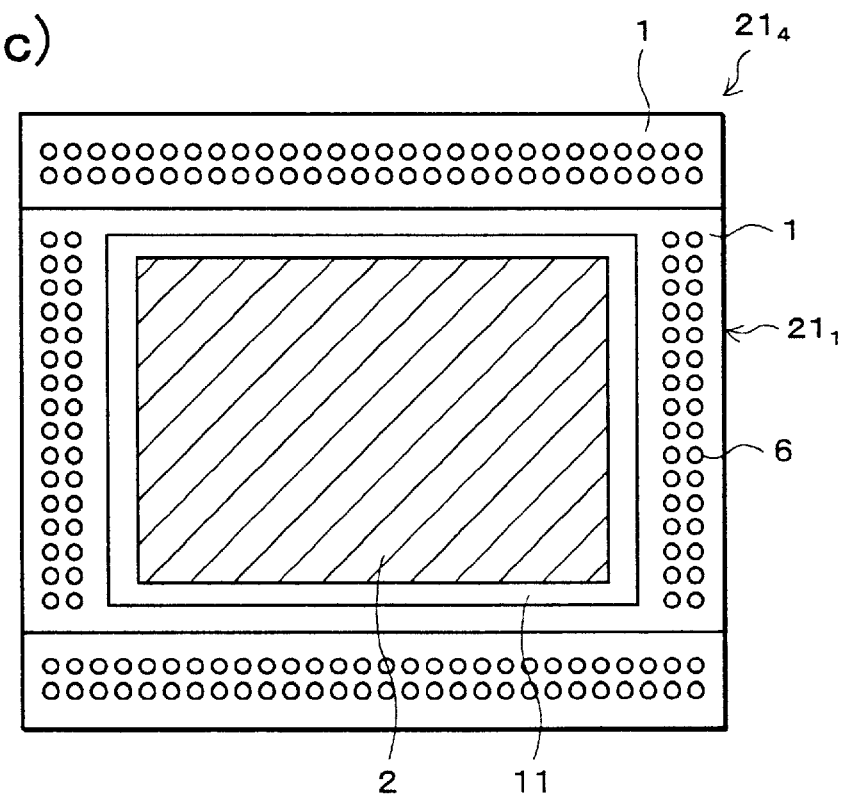

As shown in FIG. 13, one or more reinforcing terminals (reinforcing projection) 16 are provided on the periphery of the wiring substrate 1 where the land sections 6 are not provided. The reinforcing terminals 16 are according to the size (height) which is set for the connection sections of the external connection terminal sections 10 on the land sections 6, or preferably at the same height as the external connection terminal sections 10. By this, reliability of connection between each stacked semiconductor device 21 or between the semiconductor device 21 and the mounting substrate can be further improved.

FIG. 14(a) to FIG. 14(c) show a different pattern of stack as in the case of a semiconductor chip 2 for a logic circuit and a semiconductor chip 2 for a memory circuit, wherein the number of the external connection terminal sections 10 differ greatly and the external size of the chip is different as well. FIG. 14(a) is a front view, FIG. 14(b) is a side view, and FIG. 14(c) is a top view. Each figure is a description of the stack mentioned above.

When the semiconductor chip 2 having different terminal layout or different numbers of terminals are stacked as in the combination of the semiconductor chip 2 for a logic circuit and the semiconductor chip 2 for a memory circuit, for example, the wiring substrate 1 as shown in FIG. 7(a) and FIG. 7(b) and a wiring substrate 1 which is larger than the one mentioned above, as shown in FIG. 16(a) and FIG. 16(b) are used together.

Figure 15:
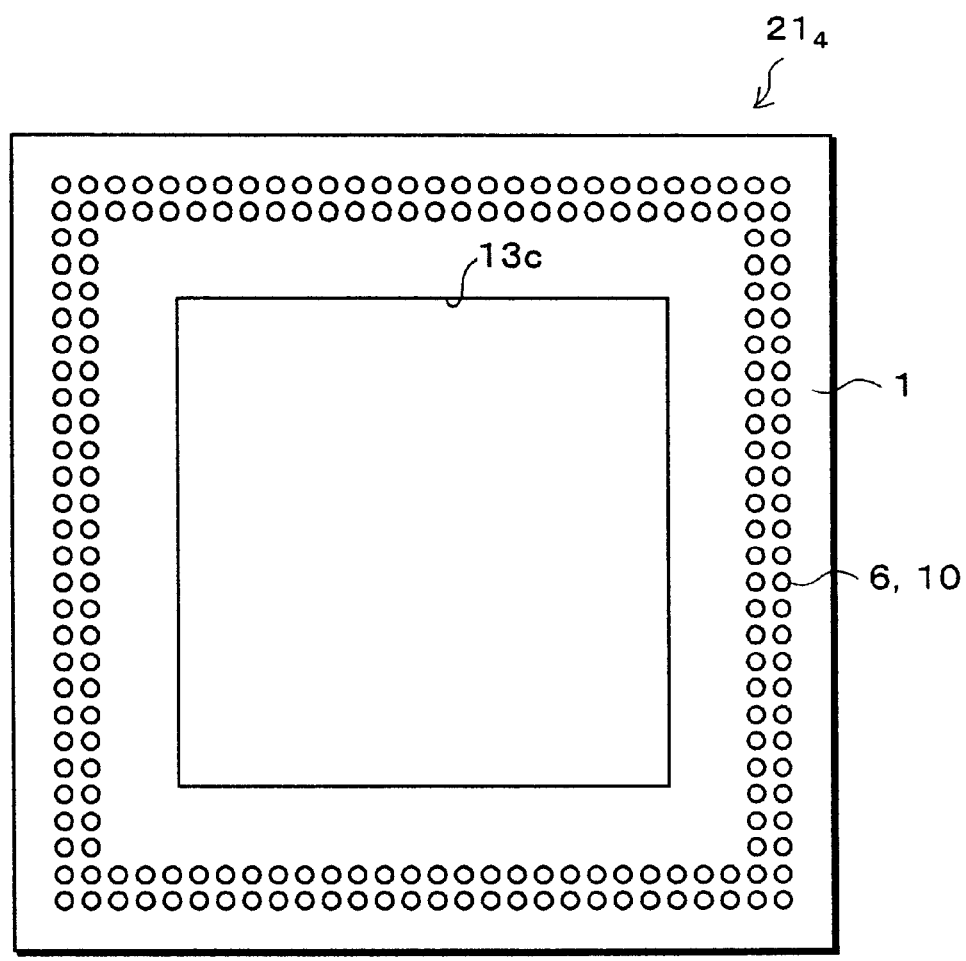
FIG. 15 is a plan view of a wiring substrate used in the package stack semiconductor device.
Figure 16:
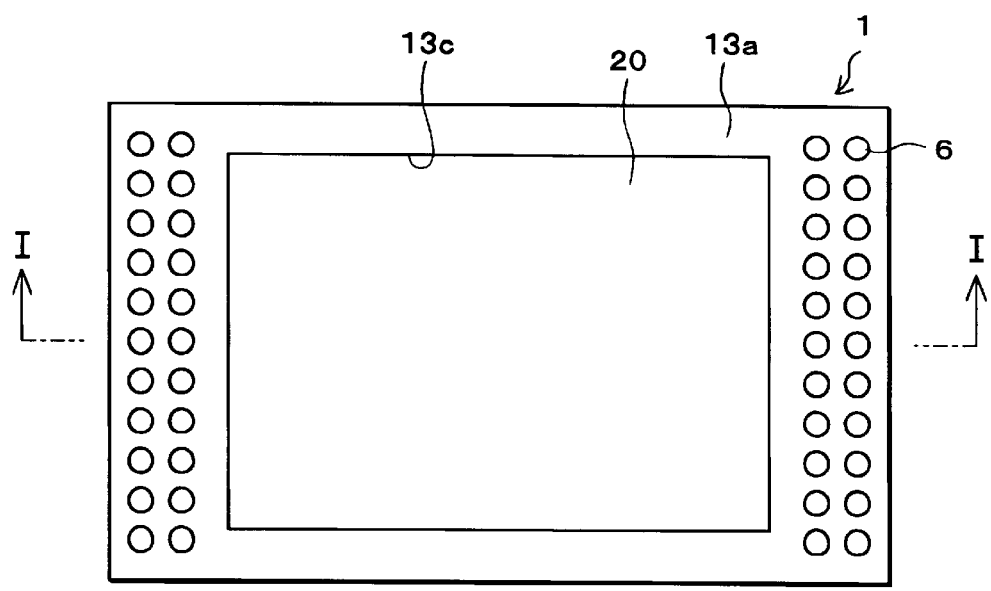
Figure 16:
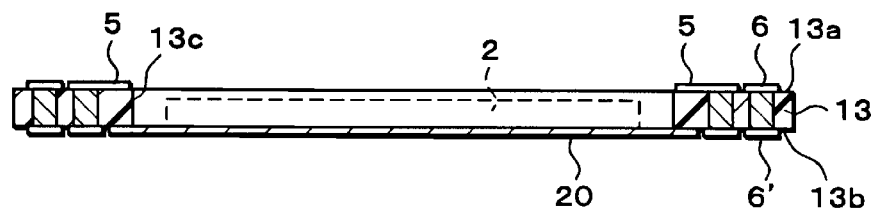

Incidentally, the semiconductor chip 2 for a logic circuit has more external connection terminal sections 10 than the semiconductor chip 2 for a memory circuit. Thus, in the semiconductor device which has the semiconductor chip 2 mentioned above, the wiring substrate 1 is provided with the external connection terminal sections 10 on every side of the surface as shown in FIG. 15. The external connection terminal sections 10 on two of four sides are used only for the logic circuit, and the external connection terminal sections 10 on the other two sides are used for both memory circuit and the logic circuit or used only for the memory circuit.

As shown in FIG. 14(a) to FIG. 14(c), the package stack semiconductor device has a stack structure of a semiconductor device $21_4$ of the wiring substrate 1 which has the semiconductor chip 2 for the logic circuit placed on the lowest position, and semiconductor device $21_1$ to $21_3$ which have the semiconductor chip 2 for the memory circuit provided above the semiconductor device $21_4$. Thus, the external connection terminal sections 10 of the wiring substrate 1 for the memory circuit are connected to the external mounting substrate via the wiring substrate 1 for the logic circuit.

Another method of fabricating the semiconductor device according to the present invention is described below. After providing the opening section 13c where the semiconductor chip is mounted, opening section 13c on one side (on side B 13b) is covered with the same Cu foil (metallic foil) as the foil used in providing the wiring pattern 4. FIG. 16(b) shows a cross sectional view of this wiring substrate 1. The Cu foil 20 is used instead of the film 12 mentioned above. The Cu foil 20 is also provided on the other side of the terminal sections 5 for wire bonding, so as to improve wire bonding.

A process of fabricating the wiring substrate 1 which has the Cu foil 20 is described below. In the first place, the semiconductor chip 2 is mounted on the Cu foil 20 of the opening section 13c, and after connecting the semiconductor chip 2 and the terminal sections 5 of the wiring substrate 1 via the Au wires 3 by the wire bonding, the circuit forming surface of the semiconductor chip 2 and the Au wires 3 are sealed with resin. Thereafter, the external connection terminal sections 10 are provided on the land sections 6 making up the external connection terminals.

After that, the wiring substrate 1 in the form of a frame is pasted to a film for dicing connection and is cut into pieces. The Cu foil 20 remains on the back of the semiconductor chip 2 of the semiconductor device which was divided by dicing. The Cu foil 20 not only has the advantage of not requiring the film 12 in assemblage of the semiconductor device, but also has the effect of protecting the back of the semiconductor chip 2, among other effects such as shielding electromagnetic wave and releasing heat.

Yet another method of fabricating the semiconductor device according to the present invention is described below. A wire bonder equipped with a chip supply device is used in this method, which is described more concretely below, based on FIG. 5(a) to FIG. 5(e).

In the first place, with respect to the wiring substrate 1 which is fixed on a stage section of the wire bonder, the semiconductor chip 2 is supplied to a portion of the stage which is exposed through the opening section 13c where the semiconductor chip is to be mounted, and wire bonding is carried out after fixing the semiconductor chip 2 on the stage by vacuum suction. Since the semiconductor chip 2 used in the semiconductor device mentioned above is thin (150 μm or less), it can be held by only the Au wires 3 until they are sealed with resin after wire bonding.

In the first through fourth embodiments, the glass epoxy was used as a material of the wiring substrate 1. However, not only the glass epoxy but also resin such as polyimide, BT (bismaleimide•etriazine) resin, and aramid can be used.

The Fifth Embodiment

Figure 17:
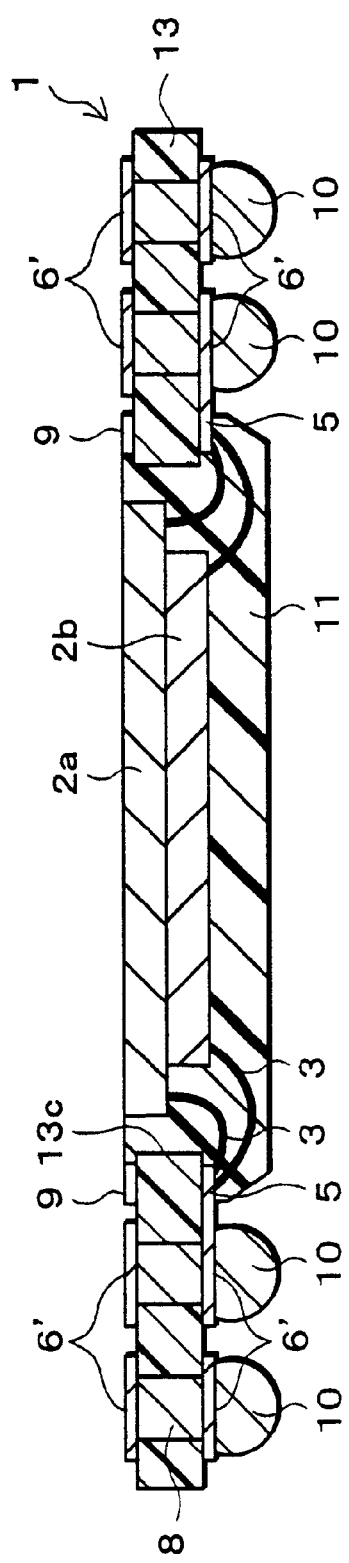
FIG. 17 is a cross sectional view of yet another modified example of the semiconductor device.

FIG. 17 is a cross sectional view of a semiconductor device according to the fifth embodiment of the present invention. The semiconductor device of the present invention has a structure including two semiconductor chip 2a and 2b in the semiconductor device of the third embodiment. Each semiconductor chip 2a and 2b used in the semiconductor device is thinner than the semiconductor chip 2 used in the semiconductor device of the third embodiment.

In the semiconductor device according to the fifth embodiment, the first semiconductor chip 2a is provided on the film 12 as in the third embodiment, and the second semiconductor chip 2b having a film of a heat bonding type pasted on the back surface is die bonded with the circuit forming surface of the first semiconductor chip 2a. Thereafter, each semiconductor chip 2a and 2b is connected to the wiring substrate 1 via Au wires 3 by wire bonding. Then, they are sealed with resin, and external connection terminal section 10 is provided, and the semiconductor device is cut into pieces.

The second semiconductor chip 2b may wire bonded with the wiring substrate 1 directly, or may be electrically connected to the wiring substrate 1 via the first semiconductor chip 2a wire bonded with the second semiconductor chip 2b. The number of stacked semiconductor chips is not just limited to two stages but they can be stacked in the same manner in three or more stages.

Figure 18:
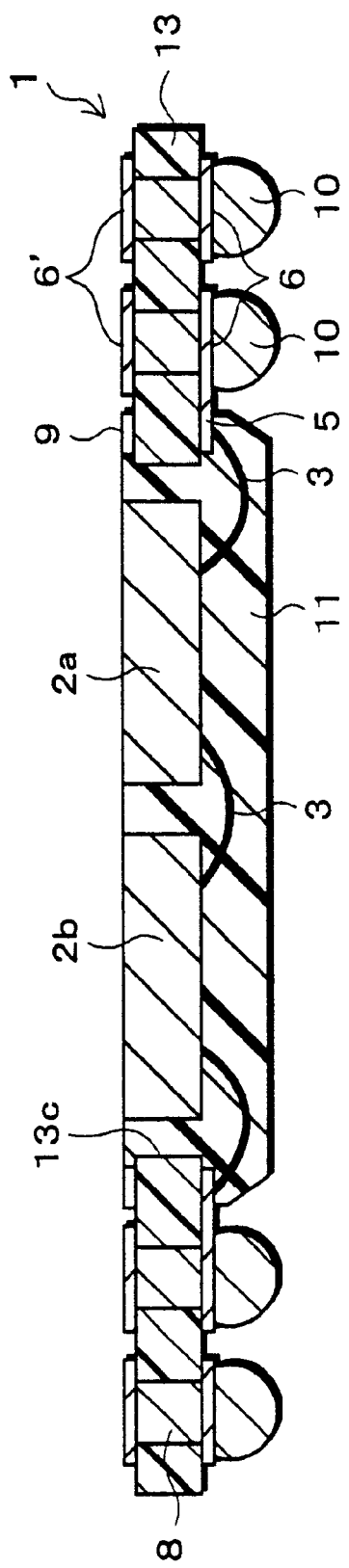
FIG. 18 is a cross sectional view of yet another modified example of the semiconductor device.
Figure 19:
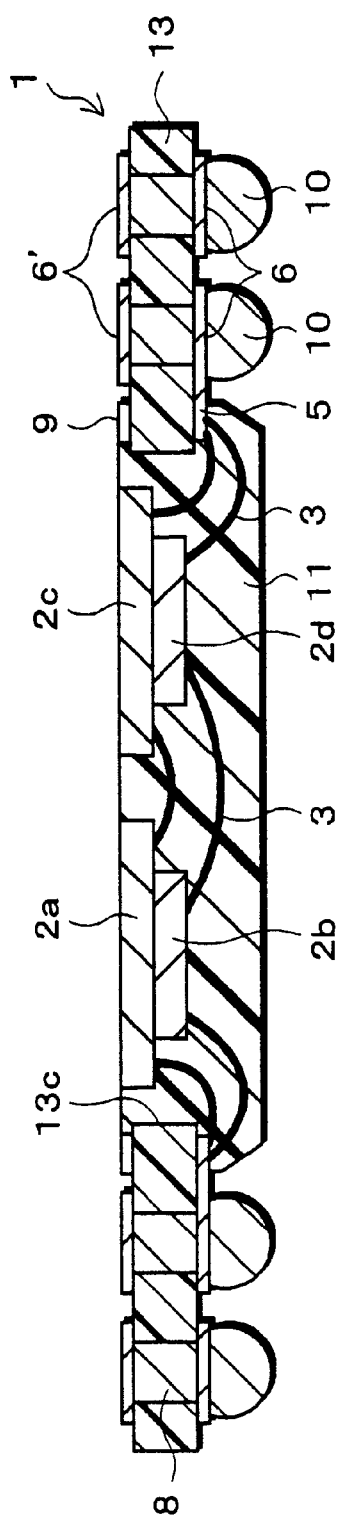
FIG. 19 is a cross sectional view of yet another modified example of the semiconductor device.
Figure 20:
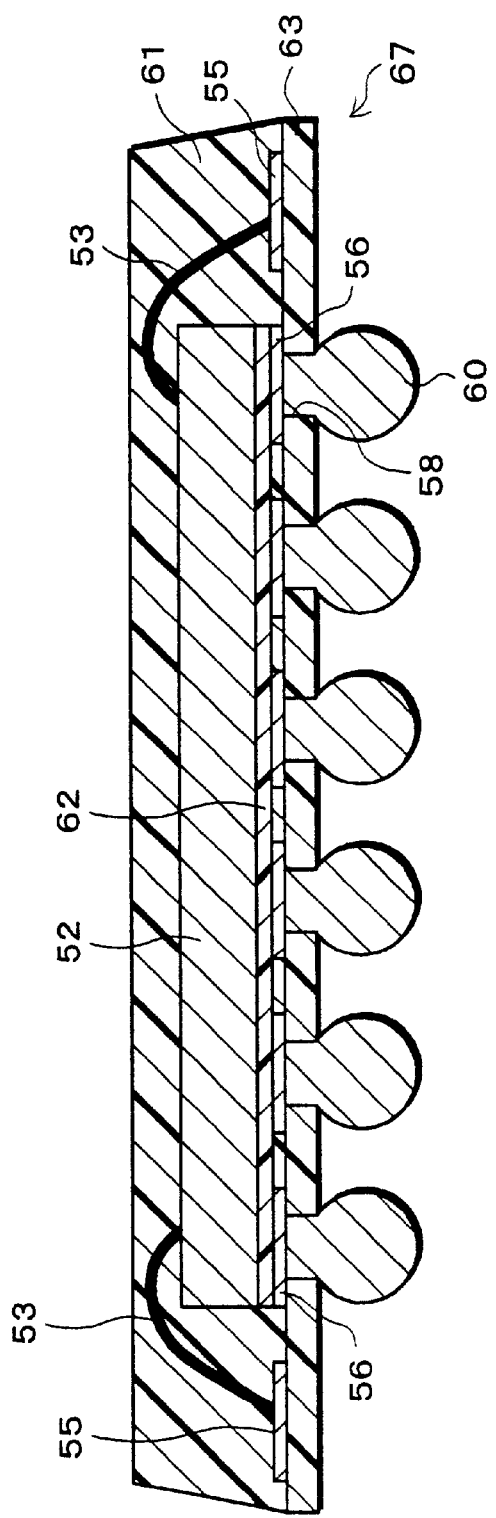
FIG. 20 is a cross sectional view of a conventional semiconductor device.
Figure 21:
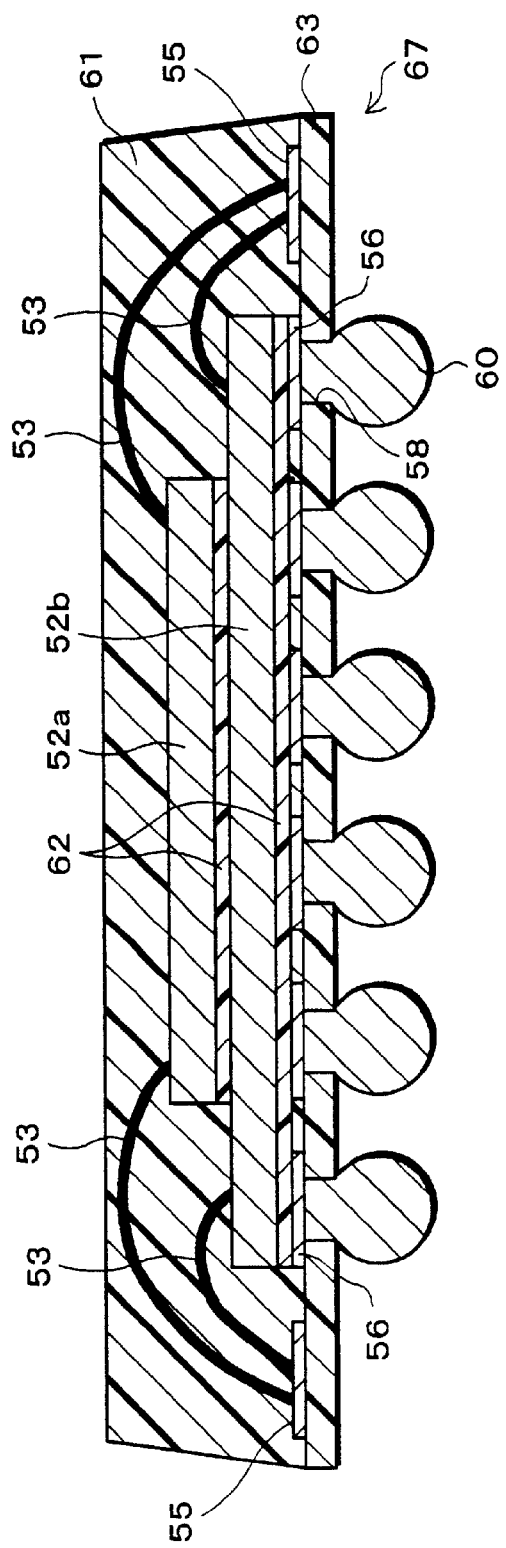
FIG. 21 is a cross sectional view of another conventional semiconductor device.
Figure 22:
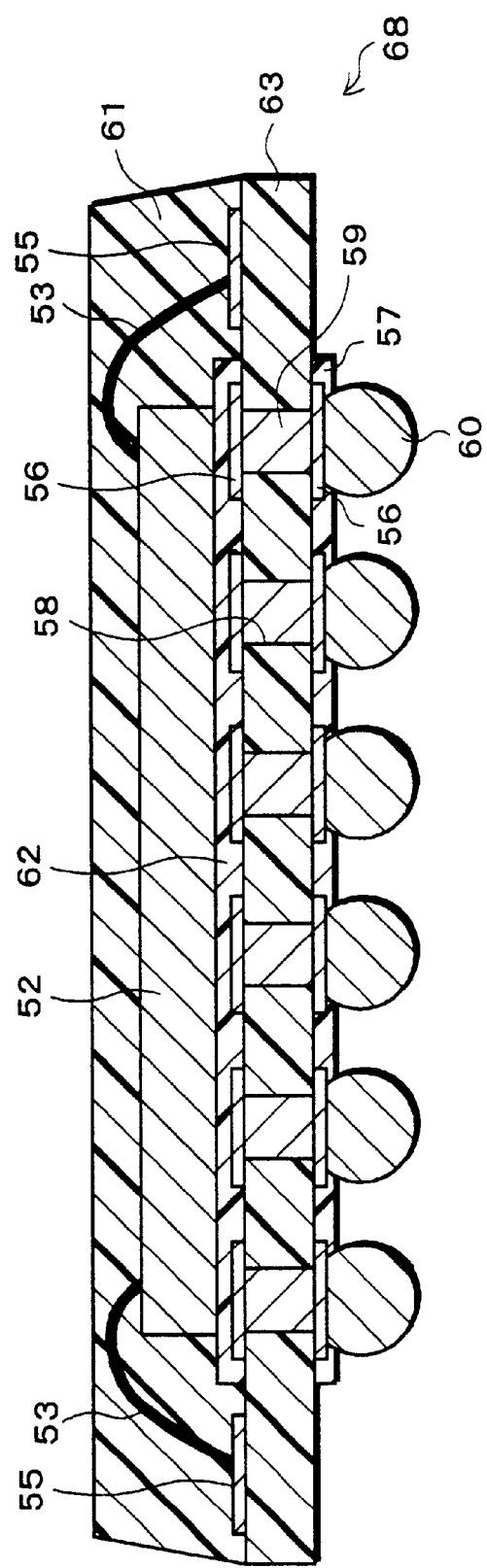
FIG. 22 is a cross sectional view of yet another conventional semiconductor device.
Figure 23:
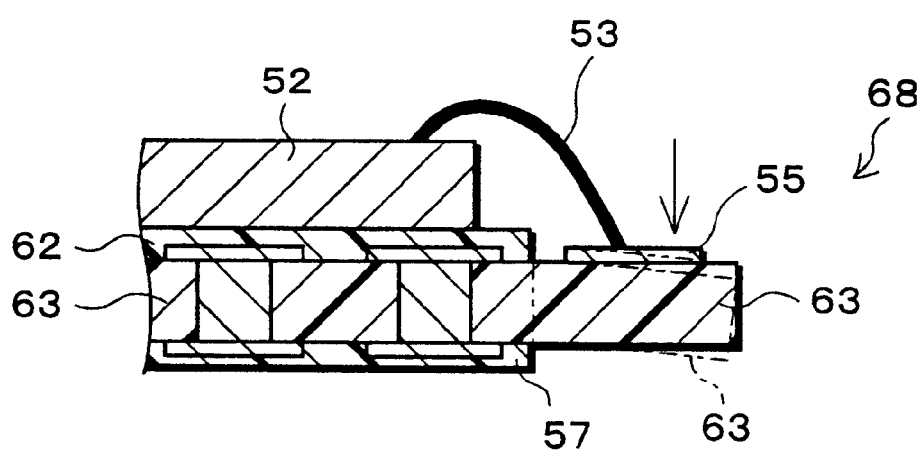
FIG. 23 is a cross sectional view of a main portion which shows deformation of an insulating substrate of the semiconductor device in wire bonding.

Further, as shown in FIG. 18, instead of laminating the semiconductor chips 2, they may be placed side by side on the same plane two-dimensionally. Further, as shown in FIG. 19, additional semiconductor chips 2a and 2b may be stacked in a direction of thickness with respect to the semiconductor chips 2a and 2c which are placed side by side on the same plane. Further, in the wiring substrate 1 of the present invention, the number of layers of the wiring pattern 4 is not just limited to two, but the wiring substrate 1 may have a larger number of layers.

As described, a wiring substrate of the present invention, includes an insulating substrate, a terminal section, provided on a first surface of the insulating substrate by wire bonding; a land section, provided on the insulating substrate, for an external connection terminal; wiring patterns, respectively provided on the first surface and a second surface on the other side of the first surface, for making electrical connection between the terminal section and the land section; and a support pattern, provided on the second surface corresponding in position to the terminal section, for improving wire bonding.

Another wiring substrate of the present invention, as described above, includes an insulating substrate, a terminal section provided on a first surface of the insulating substrate, for making connection by wire bonding; a first land section provided on the first surface for an external connection terminal; a second land section provided on a second surface on the other side of the first surface, for interconnecting semiconductor devices; wiring patterns, respectively provided on the first surface and the second surface, for making electrical connection between the terminal section, the first land section, and the second land; and a support pattern provided on the second surface corresponding in position to the terminal section for improving wire bonding.

Yet another wiring substrate of the present invention, as described above, includes an insulating substrate, a terminal section, provided on a first surface of the insulating substrate, for making flip-chip connection; a first land section, provided on the first surface, for an external connection terminal; a second land section, provided on the second surface on the other side of the first surface, for interconnecting semiconductor devices; wiring patterns, respectively provided on the first surface and the second surface, for making electrical connection between the terminal section, the first land section, and the second land section; a support pattern, provided on the second surface corresponding in position to the terminal section, for improving reliability of connection.

Yet another wiring substrate of the present invention, as described above, includes an insulating substrate having an opening section for mounting a semiconductor chip in the middle of the insulating substrate; a terminal section, provided on the first surface of the insulating substrate, for connecting to a semiconductor chip by wire bonding; a first land section, provided on the first surface, for an external connection terminal; a second land section, provided on a second surface on the other side of the first surface, for interconnecting semiconductor devices; wiring patterns, respectively provided on the first surface and the second surface, for making electrical connection between the terminal section, the first land section, and the second land section; a support pattern, provided on the second surface corresponding in position to the terminal section for improving wire bonding.

According to the arrangements mentioned above, the wiring patterns for making electrical connection between the terminal section and the first and second land sections are provided on the first and second surface, respectively. Thus, the wiring patterns ensure to connect the terminal section and the first and second land sections, even when the semiconductor chip which has many input/output terminals is mounted.

Further, with the foregoing arrangements, when the terminal section is connected by wire bonding or by flip-chip, even when a load is applied on the terminal section in a direction of thickness of the insulating substrate, the support pattern provided on a position corresponding to the terminal section can hold the pressure.

Therefore, with the foregoing arrangement, the support pattern can avoid deformation of the insulating substrate mentioned above. Thus, a load can be applied to the insulating substrate sufficiently in wire bonding and in flip-chip connecting. As a result, reliability of the connection based on wire bonding and flip-chip can be improved.

The wiring substrate which has the opening section may be provided with a heat resistant film for mounting a semiconductor chip, provided so as to cover an opening of the opening section on the second surface. The film makes it easier to provide the opening section with the semiconductor chip.

The wiring substrate which has the opening section may be provided with a metallic foil for mounting the semiconductor chip, provided so as to cover an opening of the opening section on the second surface.

With this arrangement, the metallic foil makes it easier to provide the opening section with the semiconductor chip. Besides, the metallic foil can protect the backside of the semiconductor chip, and can shield electromagnetic wave, and can improve radiating heat.

Preferably, the shape of the support pattern corresponds to the shape of the terminal section in the wiring substrate mentioned above. According to this arrangement, it is further ensured that deformation of the insulating substrate by the support pattern can be avoided in making connection based on wire bonding or flip-chip connection.

In the wiring substrate mentioned above, the support pattern may be connected to the second land section. According to this arrangement, the support pattern can be used as one of the wiring patterns. This simplifies manufacture of the wiring substrate.

The wiring substrate mentioned above may have the wiring patterns in multi-layers. With this arrangement, by the multi-layered wiring pattern, for example, connection among the terminal section, the first land section, and the second land section can be ensured by the wiring patterns, even when the number of input/output terminals of the semiconductor chip is increased.

Preferably, the support pattern is provided according to the height of the wiring pattern on the second surface in the insulating substrate mentioned above. With this arrangement, the support pattern can support the insulating substrate more securely in making connection based on wire bonding and flip-chip connection. As a result, reliability of connection based on wire bonding and flip-chip connection can be improved further.

As described, a semiconductor device of the present invention includes any one of the wiring substrates having the terminal section connected by wire bonding, a semiconductor chip mounted on the wiring substrate, a bonding wire section for making electrical connection between the wiring substrate and the semiconductor chip, a resin sealing section for sealing a circuit forming surface of the semiconductor chip and the bonding wire section, and a conductive member provided on the second land section for connecting the semiconductor chip to outside.

According to the arrangement mentioned above, by the provision of the wiring substrate having the support pattern on a position corresponding to the terminal section, reliability of connection based on wire bonding by the bonding wire section can be improved, thereby improving reliability of the device.

Yet another semiconductor device of the present invention, as described above, includes any one of the wiring substrate for flip-chip connection, a semiconductor chip which is mounted on the wiring substrate by being electrically connected thereto by flip-chip connection, a resin sealing section for sealing the circuit forming surface of the semiconductor chip, and a conductive member, provided on the second land section, for connecting the semiconductor chip to outside.

According to the arrangement mentioned above, by the provision of the wiring substrate having a support pattern on a position corresponding to the terminal section, reliability of connection based on flip-chip connection can be improved, thereby improving reliability of the device.

In the semiconductor device mentioned above, a plurality of semiconductor chips may be provided two dimensionally or three dimensionally. With this arrangement, the wiring patterns are provided respectively on the both surfaces of the insulating substrate. Thus, even when the number of the input/output terminals is increased due to the plurality of the semiconductor chips, it is easy to cope with the increased input/output terminals, and connect the semiconductor chips to the external device, and reliability of electrical connection between the semiconductor chip and outside can be improved.

In the semiconductor device mentioned above, a support projection which corresponds to the external connection terminal may be provided on the wiring substrate.

According to the arrangement mentioned above, when a plurality of semiconductor devices are stacked in a direction of thickness of the wiring substrate, and when the adjoining semiconductor devices are connected by the external connection terminals, the support projection enables the electrical connection of the semiconductor devices to be maintained. As a result, reliability of connection of the semiconductor devices can be improved.

The package stack semiconductor device of the present invention, as described above, has a plurality of semiconductor devices which are stacked by soldering connection.

According to the arrangement mentioned above, a plurality of semiconductor devices are stacked, for example, in a direction of thickness of the wiring substrate, and the external connection terminal sections as the conductive member of the respective semiconductor devices are connected by soldering to each other, thus connecting the semiconductor devices in a stacked form.

Further, since the foregoing arrangement uses the semiconductor device having the wiring substrate with the improved reliability of wire bond connection, reliability of connection can be improved.

In the foregoing package stack semiconductor device, it is preferable that a solder used for an external connection terminal of a semiconductor device which is exposed to outside has a lower melting point than that used for external connection terminals of stacked semiconductor devices to each other.

According to the arrangement mentioned above, the electrical connection between the stacked semiconductor devices can be carried out by reflow soldering at a melting point according to the solder of the electrical connection terminals of the other semiconductor devices.

While, according to the foregoing arrangement, when the exposed external connection terminals of the semiconductor device which are exposed to outside are to be electrically connected, for example, to the external mounting substrate (external device), they can be soldered at lower melting point than terminals of other semiconductor devices. Thus, this can prevent melting of solder between other stacked semiconductor devices, and can connect them electrically.

In the package stack semiconductor device mentioned above, fixing resin may be injected into gaps between adjoining semiconductor devices. With this arrangement, fixing resin prevents deformation and vibration of each semiconductor device, thus further improving reliability of connection.

In the foregoing package stack semiconductor device, it is preferable that the layout of the external connection terminals of each semiconductor device, at least the common external connection terminals, are designed according to the position of each terminal.

According to this arrangement, at least common external connection terminals are set, taking into consideration their positions. This further ensures electrical connection between stacked semiconductor devices, in addition to making manufacture of the device easier.

In the foregoing package stack semiconductor device, at least two of the plurality of semiconductor devices have different external size.

According to this arrangement, the semiconductor chip for the logic circuit which has more input/output terminals can be provided on a semiconductor device having a larger external size, and the semiconductor chip for the memory circuit which has fewer input/output terminals can be provided on a semiconductor device having a smaller external size.

It is preferable in the foregoing package stack semiconductor device that a semiconductor device with its external connection terminal exposed to outside is a larger external size than that of other semiconductor devices.

In the arrangement mentioned above, the semiconductor chip for the logic circuit which has more input/output terminals can be provided on the semiconductor device whose external connection terminals are exposed to outside, and the semiconductor chip for the memory circuit which has fewer input/output terminals can be provided on other semiconductor devices.

With this arrangement, a semiconductor device having a larger external size, which can have many terminals, can be exposed to outside, thus ensuring electrical connection between the stacked semiconductor devices and outside.

The invention may be embodied in other specific forms without departing from the spirit or the appended claims thereof. The present embodiment is therefore to be considered in all respects as illustrative and not restrictive.

What is claimed is:

1. A wiring substrate comprising:

an insulating substrate;

a terminal section, provided on a first surface of the insulating substrate, for making connection by wire bonding;

a land section, provided on the insulating substrate, for an external connection terminal;

wiring patterns, respectively provided on the first surface and a second surface on the other side of the first surface, for making electrical connection between the terminal section and the land section; and a support pattern, provided on the second surface corresponding in position to the terminal section, for improving wire bonding connection, wherein the support pattern is not electrically connected to one of the terminal section and first and second land section.

2. The wiring substrate as set forth in claim 1, wherein a shape of the support pattern corresponds to a shape of the terminal section.

3. The wiring substrate as set forth in claim 1, wherein the support pattern is connected to the land section.

4. The wiring substrate as set forth in claim 1, wherein the wiring patterns are provided in multi/layers.

5. The wiring substrate as set forth in claim 1, wherein the support pattern is provided according to a height of the wiring pattern on the second surface of the insulating substrate on the second surface.

6. A wiring substrate comprising:
   an insulating substrate;
   a terminal section, provided on a first surface of the insulating substrate, for making connection by wire bonding;
   a first land section, provided on the first surface, for an external connection terminal;
   a second land section, provided on a second surface on the other side of the first surface, for interconnecting semiconductor devices;
   wiring patterns, respectively provided on the first surface and the second surface, for making electrical connection between the terminal section, the first land section, and the second land section; and
   a support pattern, provided on the second surface corresponding in position to the terminal section, for improving wire bonding connection, wherein the support pattern is not electrically connected to one of the terminal section and first and second land sections.

7. A wiring substrate comprising:
   an insulating substrate;
   a terminal section, provided on a first surface of the insulating substrate, for making flip-chip connection;
   a first land section, provided on the first surface, for an external connection terminal;
   a second land section, provided on a second surface on the other side of the first surface, for interconnecting semiconductor devices;
   wiring patterns, respectively provided on the first surface and the second surface, for electrical connection between the terminal section, the first land section, and the second land section; and
   a support pattern, provided on the second surface corresponding in position to the terminal section, for improving reliability of connection, wherein the support pattern is not electrically connected to one of the terminal section and first and second land sections.

8. A wiring substrate comprising:
   an insulating substrate having an opening section for mounting a semiconductor chip in the middle of said insulating substrate;
   a terminal section, provided on a first surface of the insulating substrate, for connecting to the semiconductor chip by wire bonding:
   a first land section, provided on the first surface, for an external connection terminal;
   a second land section, provided on a second surface on the other side of the first surface, for interconnecting semiconductor devices;
   wiring patterns, respectively provided on the first surface and the second surface, for making electrical connection between the terminal section, the first land section, and the second land section for interconnecting semiconductor devices; and
   a support pattern, provided on the second surface corresponding in position to the terminal section, for improving wire bonding connection, wherein the support pattern is not electrically connected to one of the terminal section and first and second land sections.

9. The wiring substrate as set forth in claim 8, wherein a heat resistant film for mounting the semiconductor chip is provided so as to cover an opening of an opening section on the second surface.

10. The wiring substrate as set forth in claim 8, wherein a metallic foil for mounting the semiconductor chip is provided so as to cover an opening of the opening section on the second surface.

11. A semiconductor device comprising:
    an insulating substrate;
    a terminal section, provided on a first surface of the insulating substrate, for making connection by wire bonding;
    a land section, provided on the insulating substrate, for an external connection terminal;
    wiring patterns, respectively provided on the first surface and a second surface on the other side of the first surface, for making electrical connection between the terminal section and the land section;
    a support pattern, provided on the second surface corresponding in position to the terminal section, for improving wire bonding connection, wherein the support pattern is not electrically connected to one of the terminal section and land section;
    a semiconductor chip mounted on the insulating substrate;
    a bonding wire section for making electrical connection between the terminal section and the semiconductor chip;
    a resin sealing section for sealing a circuit forming surface of the semiconductor chip and the bonding wire section; and
    a conductive member, provided on the land section, for connecting the semiconductor chip to outside.

12. The semiconductor device as set forth in claim 11, wherein said semiconductor chip is provided in plurality on the insulating substrate two-dimensionally or three dimensionally.

13. A semiconductor device comprising:
    an insulating substrate;
    a terminal section, provided on a first surface of the insulating substrate, for making connection by wire bonding;
    a first land section, provided on the first surface, for an external connection terminal;
    a second land section, provided on a second surface on the other side of the first surface, for interconnecting semiconductor devices;
    wiring patterns, respectively provided on the first surface and the second surface, for making electrical connection between the terminal section, the first land section, and the second land section;
    a support pattern, provided on the second surface corresponding in position to the terminal section, for improving wire bonding connection, wherein the support pattern is not electrically connected to one of the terminal section and first and second land sections;
    a semiconductor chip mounted on the insulating substrate;
    a bonding wire section for making electrical connecting between the terminal section and the semiconductor chip;
    a resin sealing section for sealing a circuit forming surface of the semiconductor chip and the bonding wire section; and
    a conductive member, provided on the second land section, for connecting the semiconductor chip to outside.

14. A semiconductor device comprising:
    an insulating substrate having an opening section in the middle of the insulating substrate;

a terminal section, provided on a first surface of the insulating substrate, for connecting by wire bonding;

a first land section, provided on the first surface, for an external connection terminal;

a second land section, provided on a second surface on the other side of the first surface for interconnecting semiconductor devices;

wiring patterns, respectively provided on the first surface and the second surface, for making electrical connection between the terminal section, the first land section, and the second land section;

a support pattern, provided on the second surface corresponding in position to the terminal section, for improving wire bonding connection, wherein the support pattern is not electrically connected to one of the terminal section and first and second land sections;

a semiconductor chip mounted in the opening section;

a bonding wire section for making electrical connection between the terminal section and the semiconductor chip;

a resin sealing section for sealing a circuit forming surface of the semiconductor chip and the bonding wire section; and a conductive member, provided on the second land section, for connecting the semiconductor chip to outside.

15. The semiconductor device as set forth in claim 14, further comprising a heat resistant film for mounting the semiconductor chip which covers a second-surface opening of the opening section.

16. The semiconductor device as set forth in claim 14, further comprising a metallic foil for mounting the semiconductor chip, which is provided so as to cover an opening of the opening section on the second surface.

17. The semiconductor device set forth in claim 14, further comprising a support projection, provided on the insulating substrate, corresponding to the external connection terminal.

18. A semiconductor device comprising:

an insulating substrate;

a terminal section, provided on a first surface of the insulating substrate, for making flip-chip connection;

a first land section, provided on the first surface, for an external connection terminal;

a second land section, provided on a second surface on the other side of the first surface for interconnecting semiconductor devices;

wiring patterns, respectively provided on the first surface and the second surface, for making electrical connection between the terminal section, the first land section, and the second land section;

a support pattern, provided on the second surface corresponding in position to the terminal section, for improving reliability of connection, wherein the support pattern is not electrically connected to one of the terminal section and first and second land sections;

a semiconductor chip connected to the terminal section electrically by flip-chip connection;

a resin sealing section for sealing a circuit forming surface of the semiconductor chip; and a conductive member, provided on the second land section, for connecting the semiconductor chip to outside.

19. The semiconductor device as set forth in claim 18, wherein said semiconductor chip is provided in plurality on the insulating substrate two dimensionally or three dimensionally.

20. A package stack semiconductor device which includes a plurality of semiconductor devices, which are stacked by soldering, each of semiconductor device, comprising:

an insulating substrate;

a terminal section, provided on a first surface of the insulating substrate, for making connection by wire bonding;

a land section, provided on the insulating substrate, for an external connection terminal;

wiring patterns, respectively provided on the first surface and a second surface on the other side of the first surface, for making electrical connection between the terminal section and the land section;

a support pattern, provided on the second surface corresponding in position to the terminal section, for improving wire bonding connection, wherein the support pattern is not electrically connected to one of the terminal section and land section;

a semiconductor chip mounted on the insulating substrate;

a bonding wire section for making electrical connection between the terminal section and the semiconductor chip;

a resin sealing section for sealing a circuit forming surface of the semiconductor chip and the bonding wire section; and a conductive member, provided on the land section, for connecting the semiconductor chip to outside.

21. The package stack semiconductor device as set forth in claim 20, wherein a solder used for an external connection terminal of a semiconductor device which is exposed to outside has a lower melting point than that used for external connection terminals of other semiconductor devices.

22. The package stack semiconductor device as set forth in claim 20, wherein fixing resin is injected to gaps between adjoining semiconductor devices.

23. The package stack semiconductor device as set forth in claim 20, wherein external connection terminals of respective semiconductor devices are positioned, taking into consideration their positions, at least for those external terminals which are common among the semiconductor devices.

24. The package stack semiconductor device as set forth in claim 20, wherein at least two of said plurality of semiconductor devices have different external size.

25. The package stack semiconductor device as set forth in claim 24, wherein a semiconductor device with its external connection terminal exposed to outside has a larger external size than that of other semiconductor devices.

* * * * *